US006828247B2

(12) United States Patent
Nakagawa et al.

(10) Patent No.: US 6,828,247 B2
(45) Date of Patent: Dec. 7, 2004

(54) METHOD FOR ETCHING ORGANIC FILM, METHOD FOR FABRICATING SEMICONDUCTOR DEVICE AND PATTERN FORMATION METHOD

(75) Inventors: Hideo Nakagawa, Shiga (JP); Toshio Hayashi, Kanagawa (JP); Yasuhiro Morikawa, Kanagawa (JP)

(73) Assignees: Matsushita Electric Industrial Co., Ltd., Osaka (JP); ULVAC, Inc., Kanagawa (JP)

( * ) Notice: Subject to any disclaimer, the term of this patent is extended or adjusted under 35 U.S.C. 154(b) by 21 days.

(21) Appl. No.: 10/214,754

(22) Filed: Aug. 9, 2002

(65) Prior Publication Data
US 2002/0197747 A1 Dec. 26, 2002

Related U.S. Application Data

(62) Division of application No. 09/854,579, filed on May 15, 2001, now Pat. No. 6,451,620.

(30) Foreign Application Priority Data

May 26, 2000 (JP) ........................................ 2000-155843

(51) Int. Cl.[7] ...................... H01L 21/302; H01L 21/461
(52) U.S. Cl. ........................ 438/710; 438/714; 438/725
(58) Field of Search ................................. 438/710, 714, 438/718, 719, 720, 721, 722, 723, 724, 706, 725, 738, 788, 779, 780, 789, 790, 798, 9, 905

(56) References Cited

U.S. PATENT DOCUMENTS 4,944,026 A * 7/1990 Arakawa et al. ......... 250/484.1
5,756,401 A    5/1998 Iizuka
6,296,701 B1 * 10/2001 Christen et al. ............ 117/94
6,451,620 B2 * 9/2002 Nakagawa et al. ........... 438/9
6,518,191 B2 * 2/2003 Nakagawa ................ 438/710
6,531,402 B2 * 3/2003 Nakagawa ................ 438/710

FOREIGN PATENT DOCUMENTS

| JP | 64-25419 | 1/1989 |
|---|---|---|
| JP | 1-280316 | 11/1989 |
| JP | 10-150105 | 6/1998 |
| JP | DPS 1999 | * 11/1998 |
| JP | 11-121901 | 4/1999 |
| JP | DPS 1999 | * 11/1999 |
| JP | 2001077085 A | 3/2001 |
| WO | WO 00/67308 | 11/2000 |

OTHER PUBLICATIONS

M. Fukasawa et al., "Etching Characteristics of Organic Low–k Film", Proceedings of Symposium on Dry Process, VII–3, pp. 175–182, Nov. 1998.

M. Fukasawa et al., "Organic Low–k Film Etching Using N–H Plasma", Proceedings of Symposium on Dry Process, IV–2, pp. 221–226, Nov. 1999.

W. Chen et al., "$SiO_2$ etching in magnetic neutral loop discharge plasma", J. Vac. Sci. Technol. A, vol. 16, No. 3, May/Jun. 1998.

* cited by examiner

Primary Examiner—David Nhu
(74) Attorney, Agent, or Firm—Nixon Peabody LLP; Donald R. Studebaker

(57) ABSTRACT

An organic film is etched by using plasma generated from an etching gas including a first gas containing, as a principal constituent, a compound including carbon, hydrogen and nitrogen and a second gas including a nitrogen component.

22 Claims, 23 Drawing Sheets

CH$_3$NH$_2$ : N$_2$=50 : 50 ml

CH$_3$NH$_2$ : N$_2$=100 : 0 ml

CH$_3$NH$_2$ : N$_2$=30 : 70 ml

CH$_3$NH$_2$ : N$_2$=70 : 30 ml

CH$_3$NH$_2$ : N$_2$=0 : 100 ml

N2: LARGE AMOUNT

N2: SMALL AMOUNT

N2: LARGE AMOUNT

N2: SMALL AMOUNT

NH3 : LARGE AMOUNT

NH3 : SMALL AMOUNT

PRIOR ART  PRIOR ART  PRIOR ART  PRIOR ART
FIG. 16A  FIG. 16B  FIG. 16C  FIG. 16D
0.16μm  0.18μm  0.24μm  0.40μm
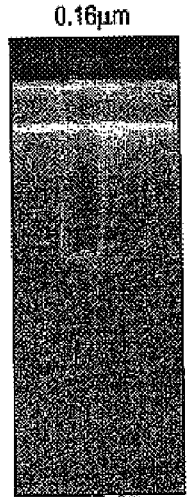 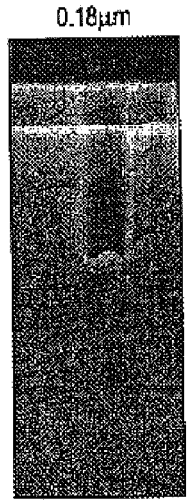 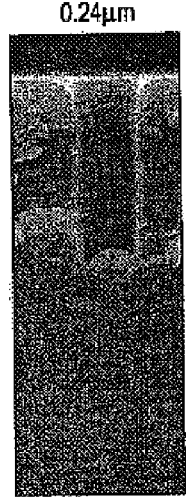 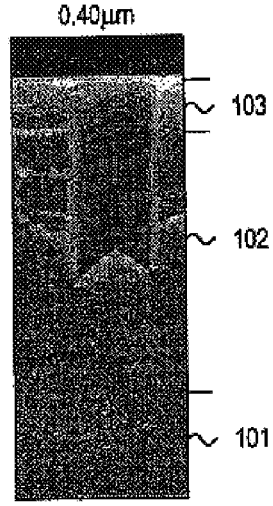
———— 1μm
5KV   X30,000   9mm

METHOD FOR ETCHING ORGANIC FILM, METHOD FOR FABRICATING SEMICONDUCTOR DEVICE AND PATTERN FORMATION METHOD

RELATED APPLICATION DATA

This application is a divisional application of U.S. patent application Ser. No 09/854,579, filed May 15, 2001, now U.S. Pat. No. 6,451,620 which claims priority to the Japanese Application No. JP2000-155843 filed May 26, 2000.

BACKGROUND OF THE INVENTION

1. Field of the Invention

The present invention relates to a method for etching an organic film, a method for fabricating a semiconductor device and a pattern formation method.

2. Description of the Related Art

For the purpose of increasing the operation speed and lowering the consumption power of semiconductor devices, decrease of the dielectric constant of an interlayer insulating film included in a multi-level interconnect structure is recently regarded as significant. In particular, an organic film with a small dielectric constant can be easily formed by spin coating and curing, and hence is regarded as a very promising interlayer insulating film of the next generation. A well known example of the organic film with a small dielectric constant is an organic film including an aromatic polymer as a base.

In order to fabricate a device with a refined design rule of a gate length of 0.18 $\mu$m or less, a fine interconnect processing technique of approximately 0.25-$\mu$m or less is necessary, and the design rule is considered to be more and more refined in the future. An organic film is generally patterned by plasma etching, but a fine pattern of 0.25 $\mu$m or less is very difficult to form from an organic film.

Known examples of the plasma etching employed for an organic film are a process using an etching gas including a $N_2$ gas and a $H_2$ gas as principal constituents (reported by M. Fukusawa, T. Hasegawa, S. Hirano and S. Kadomura in "Proc. Symp. Dry Process", p. 175 (1998)) and a process using an etching gas including a $NH_3$ gas as a principal constituent (reported by M. Fukusawa, T. Tatsumi, T. Hasegawa, S. Hirano, K. Miyata and S. Kadomura in "Proc. Symp. Dry Process", p. 221 (1999)).

CONVENTIONAL EXAMPLE 1

One of conventional etching methods will now be described as Conventional Example 1 referring to the result obtained by etching an organic film with a magnetic neutral loop discharge (NLD) plasma etching system manufactured by ULVAC JAPAN, Ltd. ("SiO$_2$ Etching in magnetic neutral loop discharge plasma", W. Chen, M. Itoh, T. Hayashi and T. Uchida, J. Vac. Sci. Technol., A16 (1998) 1594).

In Conventional Example 1, an organic film is etched by using an etching gas including a $N_2$ gas and a $H_2$ gas as principal constituents. The present inventors have carried out the etching process of Conventional Example 1 under the following conditions:

Plasma etching system: NLD plasma etching system

Volume flow ratio per minute in standard condition of etching gas:

$N_2:H_2$=50 ml:50 ml

Antenna power: 1000 W (13.56 MHz)
Bias power: 200 W (2 MHz)
Pressure: 0.4 Pa
Substrate cooling temperature: 0° C.
Etching time: 180 seconds FIGS. 16A through 16D are cross-sectional SEM photographs of holes formed under the aforementioned etching conditions in organic films, and the holes of FIGS. 16A through 16D have diameters of 0.16 $\mu$m, 0.18 $\mu$m, 0.24 $\mu$m and 0.40 $\mu$m, respectively. In FIGS. 16A through 16D, a reference numeral 101 denotes a silicon substrate, a reference numeral 102 denotes an organic film to be etched, and a reference numeral 103 denotes a mask pattern of a silicon oxide film used as a mask in etching the organic film 102. The organic film 102 has a thickness of approximately 1.02 $\mu$m, and the mask pattern 103 has a thickness of approximately 240 nm.

CONVENTIONAL EXAMPLE 2

In a multi-level interconnect structure of a semiconductor device, a lower interconnect, an interlayer insulating film and an upper interconnect are successively stacked, and the lower interconnect and the upper interconnect are connected to each other through a pillar-shaped plug formed in the interlayer insulating film. Also, single damascene and dual damascene methods have recently been developed. In the single damascene method, a via hole or an interconnect groove is formed in an interlayer insulating film and is subsequently filled with a metal material, so as to form a connection plug or a metal interconnect. In the dual damascene method, a via hole and an interconnect groove are formed in an interlayer insulating film and are subsequently filled with a metal material, so as to simultaneously form a connection plug and a metal interconnect.

Now, the conventional single damascene method will be described as Conventional Example 2 with reference to FIGS. 17A through 17E and 18A through 18D.

First, as is shown in FIG. 17A, a laminated metal interconnect consisting of a first barrier metal layer 212, a metal film 213 and a second barrier metal layer 214 is formed on a semiconductor substrate 211. Then, as is shown in FIG. 17B, an organic film 215 is formed on the metal interconnect, and thereafter, a silicon oxide film 216 is formed on the organic film 215 as is shown in FIG. 17C.

Then, a resist pattern 217 is formed on the silicon oxide film 216 by a known lithography technique as is shown in FIG. 17D. Thereafter, the silicon oxide film 216 is subjected to plasma etching (dry etching) using the resist pattern 217 as a mask, so as to form a mask pattern 216A from the silicon oxide film 216 as is shown in FIG. 17E.

Next, the organic film 215 is etched by the method for Conventional Example 1 by using the mask pattern 216A, so as to form a recess 218 for a via hole or an interconnect groove in the organic film 215 as is shown in FIG. 18A. Since the resist pattern 217 is formed from an organic compound, it is removed during the etching of the organic film 215.

Subsequently, a third barrier metal layer 219 of TiN or TaN with a small thickness is formed on the wall of the recess 218 by sputtering as is shown in FIG. 18B.

Then, the recess 218 is filled with a conducting film 222 by chemical vapor deposition (CVD) or plating as is shown in FIG. 18C, and a portion of the conducting film 222 formed outside the recess 218 is removed by chemical mechanical polishing (CMP). Thus, a connection plug or metal interconnect 223 is formed as is shown in FIG. 18D.

CONVENTIONAL EXAMPLE 3

The conventional dual damascene method will now be described as Conventional Example 3 with reference to FIGS. 19A through 19D, 20A through 20C and 21A through 21C.

First, as is shown in FIG. 19A, a lower laminated metal interconnect consisting of a first barrier metal layer 232, a metal film 233 and a second barrier metal layer 234 is formed on a semiconductor substrate 231. Then, a first organic film 235 is formed on the lower metal interconnect as is shown in FIG. 19B, and a first silicon oxide film 236 is formed on the first organic film 235 as is shown in FIG. 19C.

Next, a first resist pattern 237 having an opening for a via hole is formed on the first silicon oxide film 236 by a known lithography technique as is shown in FIG. 19D. Then, the first silicon oxide film 236 is subjected to plasma etching (dry etching) by using the first resist pattern 237 as a mask, so as to form a first mask pattern 236A from the first silicon oxide film 236 and remove the first resist pattern 237 as is shown in FIG. 20A. Thereafter, a top face of the first mask pattern 236A is cleaned so as not to damage the first organic film 235.

Then, as is shown in FIG. 20B, a second organic film 238 is formed on the first mask pattern 236A, and a second silicon oxide film 239 is formed on the second organic film 238.

Next, as is shown in FIG. 20C, a second resist pattern 240 with an opening for an interconnect groove is formed on the second silicon oxide film 239. Thereafter, the second silicon oxide film 239 is etched by using the second resist pattern 240 as a mask, so as to form a second mask pattern 239A from the second silicon oxide film 239 as is shown in FIG. 21A.

Subsequently, the second organic film 238 and the first organic film 235 are etched by the method for Conventional Example 1, so as to form an interconnect groove 241 by transferring the second mask pattern 239A onto the second organic film 238 and form a via hole 242 by transferring the first mask pattern 236A onto the first organic film 235 as is shown in FIG. 21B. FIG. 21B shows a state where the via hole 242 is being formed in the first organic film 235, and as shown in this drawing, a deposition including a reaction product generated through the reaction between the etching gas and the first organic film 235 and silicon released from the first mask pattern 236A is adhered onto the wall of the via hole 242, resulting in forming a barrier wall 243 from the deposition.

Next, the second organic film 238 and the first organic film 235 are continuously etched by the method for Conventional Example 1, so as to completely form the via hole 242 in the first organic film 235 as is shown in FIG. 21C. Thereafter, the second barrier metal layer 234 is over-etched so as to completely remove the first organic film 235 remaining on the second barrier metal layer 234. The second resist pattern 240 is completely removed through the etching and the over-etching.

Then, although not shown in the drawings, a third barrier metal layer with a small thickness is formed on the walls of the interconnect groove 241 and the via hole 242 in the same manner as in Conventional Example 2, and the interconnect groove 241 and the via hole 242 are filled with a conducting film. Thereafter, a portion of the conducting film formed outside the connection groove 241 is removed by the CMP. Thus, a connection plug and an upper metal interconnect are formed.

CONVENTIONAL EXAMPLE 4

As methods of forming a mask pattern through dry development (plasma etching) of an organic film, a top surface imaging (TSI) process, a three-layer resist process and the like are known.

In the top surface imaging process, a surface of an organic film resulting from pattern exposure is subjected to silylation, so as to selectively form a silylated layer on an exposed or unexposed portion of the organic film. Then, the organic film is subjected to dry development (plasma etching) using the silylated layer as a mask, so as to form a resist pattern.

Now, a pattern formation method using dry development (top surface imaging process) will be described as Conventional Example 4 with reference to FIGS. 22A through 22D.

First, as is shown in FIG. 22A, an organic film 252 is formed on a semiconductor substrate 251, and then a silylation target layer 253 is formed on the organic film 252.

Next, as is shown in FIG. 22B, the silylation target layer 253 is irradiated with exposing light 254 through a photomask 255 for selectively allowing the light to pass, so as to selectively form a decomposed layer 256 in the silylation target layer 253.

Then, as is shown in FIG. 22C, with the substrate temperature increased, a gaseous silylation reagent 257 is supplied onto the silylation target layer 253, so as to selectively silylate a non-decomposed portion (a portion excluding the decomposed layer 256) of the silylation target layer 253. Thus, a silylated layer 258 is formed. Instead of silylating the non-decomposed portion, the decomposed layer 256 may be silylated to form the silylated layer 258.

Next, the organic film 252 is etched by the method for Conventional Example 1 by using the silylated layer 258 as a mask, so as to form an organic film pattern (mask pattern) 252A from the organic film 252 as is shown in FIG. 22D.

CONVENTIONAL EXAMPLE 5

Another pattern formation method using dry development (three-layer resist process) will now be described as Conventional Example 5.

First, an organic film and a silicon oxide film are successively formed on a semiconductor substrate, and a thin resist pattern is then formed on the silicon oxide film.

Then, the silicon oxide film is subjected to plasma etching by using the resist pattern as a mask, so as to form a mask pattern by transferring the resist pattern onto the silicon oxide film. Thereafter, the organic film is subjected to dry development by using the mask pattern, so as to form a fine organic film pattern with a high aspect ratio from the organic film.

Next, by using a two-layer mask pattern consisting of the mask pattern and the organic film pattern, an etch target film formed on the semiconductor substrate is etched. In this manner, a fine pattern that cannot be resolved by using a single layer resist can be formed in the etch target film.

The present inventors have carried out the etching method for an organic film of Conventional Example 5 by using an etching gas including an $O_2$ gas under the following etching conditions:

Plasma etching system: NLD plasma etching system

Flow rate per minute in standard condition of etching gas:

$O_2$=90 ml

Antenna power: 1000 W (13.56 MHz)

Bias power: 400 W (2 MHz)

Pressure: 0.133 Pa

Substrate cooling temperature: 0° C.

Etching time: 4 minutes

FIGS. 23A and 23B are cross-sectional SEM photographs of holes formed in organic film patterns by the pattern formation method for Conventional Example 5, and the holes of FIGS. 23A and 23B have diameters of 0.18 µm and 0.4 µm, respectively. In FIGS. 23A and 23B, a reference numeral 271 denotes a silicon substrate, a reference numeral 272 denotes an organic film pattern, and a reference numeral 273 denotes a mask pattern of a silicon oxide film. The resist pattern formed on the mask pattern 273 is eliminated during formation of the organic film pattern by the dry development, and hence, the etch target film deposited on the silicon substrate 271 is etched by using a two-layer mask pattern consisting of the organic film pattern 272 and the mask pattern 273.

PROBLEM OF CONVENTIONAL EXAMPLE 1

The etch shape (the cross-sectional shape of the hole) is apparently a good anisotropic shape (vertical shape) as is shown in FIGS. 16A through 16D.

It is, however, understood through detailed observation of FIGS. 16A through 16D that the hole actually has a bowing cross-section. A bowing cross-section means an arched overhang cross-section. As is obvious from FIGS. 16A through 16D, the hole formed in the organic film 102 through the etching has a larger diameter than the diameter of the opening of the mask pattern 103.

Accordingly, the etching method for Conventional Example 1 has a problem that a hole formed in the organic film 102 cannot have a cross-section tapered toward the bottom (hereinafter referred to as a forward taper cross-section).

PROBLEM OF CONVENTIONAL EXAMPLE 2

In Conventional Example 2, when the organic film 215 is etched by the method for Conventional Example 1, the recess 218 is formed to have a bowing cross-section as is shown in FIG. 18A.

Since the cross-section of the recess 218 is in the bowing shape, when the third barrier metal layer 219 with a small thickness is formed on the wall of the recess 218, the third barrier metal layer 219 cannot be uniformly formed on the wall of the recess 218 as is shown in FIG. 18B. Specifically, the third barrier metal layer 219 is separated (disconnected) in a portion 220 just below the mask pattern 216A on the wall of the recess 218 and on a bottom 221 of the recess 218.

Accordingly, in forming the connection plug or the metal interconnect 223 by filling the recess 218 with the conducting film 222 by the CVD or plating, the conducting film 222 cannot be uniformly filled. Specifically, since the third barrier metal layer 219 is separated in the portion 220 just below the mask pattern 216A on the wall of the recess 218 and on the bottom 221 of the recess 218, the third barrier metal layer 219 is electrically insulated, namely, separated. Therefore, for example, when the conducting film 222 of copper is filled by electroplating, an electric potential cannot be applied to a portion of the third barrier metal layer 219 inside the recess 218, and hence, the conducting film 222 cannot be uniformly filled in the recess 218. Alternatively, when the recess 218 is filled with the conducting film 222 of tungsten, a tungsten film is abnormally grown in the separated portions of the third barrier metal layer 219, and hence, the conducting film 222 cannot be uniformly filled in the recess 218. Since the conducting film 222 cannot be uniformly filled in the recess 218 in this manner, the connection plug or metal interconnect 223 is defective. As a result, the electric characteristic is disadvantageously degraded so as to degrade the reliability of the semiconductor device.

PROBLEM OF CONVENTIONAL EXAMPLE 3

In Conventional Example 3, when the second organic film 238 and the first organic film 235 are etched by the method for Conventional Example 1, the interconnect groove 241 and the via hole 242 are formed to have a bowing cross-section as is shown in FIG. 21B.

Furthermore, the deposition including the reaction product and silicon is adhered onto the wall of the via hole 242 as described above. In addition, while the second barrier metal layer 234 is over-etched, the first mask pattern 236A serving as an effective etching mask for forming the via hole 242 is etched through ion sputtering during the etching. Accordingly, the opening of the first mask pattern 236A is enlarged as is shown in FIG. 21C. Therefore, the bowing cross-section of the via hole 242 in the first organic film 235 becomes more serious, and since the wall of the via hole 242 is thus recessed, the barrier wall 243 in a crown shape is formed on the bottom of the via hole 242 from the deposition including the reaction product generated in the etching and silicon.

Accordingly, when the interconnect groove 241 and the via hole 242 are filled with the conducting film by the CVD or plating to form the connection plug and the metal interconnect, the conducting film cannot be uniformly filled, and a connection failure is caused between the connection plug filled in the via hole 242 and the lower metal interconnect. As a result, a multi-level interconnect structure is difficult to form by the dual damascene method.

PROBLEM OF CONVENTIONAL EXAMPLE 4

In Conventional Example 4, when the organic film 252 is etched by the method for Conventional Example 1, the opening 259 of the organic film pattern 252A is formed to have a bowing cross-section as is shown in FIG. 22D. When the organic film pattern 252A having such a hole with the bowing cross-section is used for etching mask, it is difficult to conduct highly precise etching.

PROBLEM OF CONVENTIONAL EXAMPLE 5

In Conventional Example 5, since the organic film is subjected to the dry development carried out by plasma etching using an etching gas including an $O_2$ gas as a principal constituent, the hole formed in the organic film pattern 272 has a larger diameter than the opening of the mask pattern 273 and the hole formed in the organic film pattern 272 has a bowing cross-section as is shown in FIGS. 23A and 23B. When the organic film pattern 272 having such a hole with the bowing cross-section is used for etching the etch target film, it is difficult to conduct highly precise etching.

Therefore, in a method proposed for suppressing the hole of the organic film pattern 272 from having a bowing cross-section, the dry development is carried out on the organic film with the actual substrate temperature kept at a temperature below the freezing point by setting the substrate cooling temperature (refrigerant temperature) to 20° C. through 50° C. below zero.

In order to attain such a low temperature, however, excessive cost and a large-scaled system are required, and hence, there arise problems of increase of the system cost and decrease of the system stability.

Accordingly, it is impossible to form a hole with a forward taper cross-section in an organic film pattern by the method for Conventional Example 5.

Needless to say, the problems of Conventional Example 5 (the three-layer resist process) also arise in Conventional Example 4 (the top surface imaging process).

SUMMARY OF THE INVENTION

In consideration of the aforementioned conventional problems, a first object of the invention is forming a recess with a forward taper cross-section in an organic film by etching the organic film.

A second object of the invention is forming a recess with a forward taper cross-section in an organic film by plasma etching and uniformly forming a barrier metal layer on the wall of the recess, so that the recess can be uniformly filled with a conducting film.

Furthermore, a third object of the invention is forming an organic film pattern having an opening with a forward taper cross-section in dry development (plasma etching) of the organic film, so as to precisely conduct the etching with a large process margin.

The first method for etching an organic film of this invention comprises a step of etching an organic film by using plasma generated from an etching gas containing a first gas including, as a principal constituent, a compound including carbon, hydrogen and nitrogen and a second gas including a nitrogen component.

In the first method for etching an organic film, since the etching gas includes the compound including carbon, hydrogen and nitrogen, the plasma generated from the etching gas includes radicals of $CH_x$ (wherein x is 1, 2 or 3) that can easily form a polymer on an etch target surface. The polymer of the $CH_x$ radicals adhered onto the wall of a recess formed in the organic film works as a sidewall protection film for preventing an ion assisted reaction, and hence, the recess can be formed to have a forward taper cross-section. Furthermore, since the nitrogen component for supplying N ions to the plasma is included in the etching gas, a substantially constant etching rate can be kept, and the angle of the forward taper cross-section of the recess can be controlled by adjusting the mixing ratio of the nitrogen component.

Accordingly, in the first method for etching an organic film, a recess with a forward taper cross-section can be formed in an organic film, and the angle of the forward taper cross-section can be controlled while keeping a substantially constant etching rate.

In the first method for etching an organic film, the second gas is preferably a nitrogen gas.

In this manner, N ions and $N_2$ ions can be supplied to the plasma, and hence, the angle of the forward taper cross-section of the recess can be easily controlled.

In the first method for etching an organic film, the second gas is preferably a mixed gas including a nitrogen gas and a hydrogen gas.

In this manner, while keeping controllability of the angle of the forward taper cross-section of the recess, the etching rate can be improved.

In the first method for etching an organic film, the second gas is preferably an ammonia gas.

In this manner, the controllability of the angle of the forward taper cross-section of the recess and the improvement of the etching rate can be both realized.

In the first method for etching an organic film, the second gas preferably further includes a rare gas.

In this manner, a deposition film formed on inner walls of a reaction chamber can be reduced, so as to reduce the frequency of cleaning the reaction chamber. Therefore, the reaction chamber can be kept in a stable state. Furthermore, the recess can be more definitely formed in a forward taper cross-section.

The second method for etching an organic film of this invention comprises a step of etching an organic film by using plasma generated from an etching gas containing a first gas including, as a principal constituent, a compound including carbon, hydrogen and nitrogen and a second gas including a rare gas.

In the second method for etching an organic film, since the etching gas includes the compound including carbon, hydrogen and nitrogen as well as the rare gas, a recess having a forward taper cross-section can be definitely formed in the organic film. Furthermore, a deposition film formed on inner walls of a reaction chamber can be reduced, so as to reduce the frequency of cleaning the reaction chamber. Therefore, the reaction chamber can be kept in a stable state for a long period of time.

Accordingly, in the second method for etching an organic film, a recess can be definitely formed in an organic film to have a forward taper cross-section, and a deposition film formed on inner walls of a reaction chamber can be reduced so as to keep the reaction chamber in a stable state.

The third method for etching an organic film of this invention comprises a step of etching an organic film by using plasma generated from an etching gas containing a first gas including, as a principal constituent, a compound including carbon, hydrogen and nitrogen and a second gas including an oxygen component.

In the third method for etching an organic film, since the etching gas includes the compound including carbon, hydrogen and nitrogen, a recess formed in the organic film can attain a forward taper cross-section. Furthermore, since the etching gas includes the oxygen component, the etching rate can be improved.

Accordingly, in the third method for etching an organic film, while improving the etching rate, a recess with a forward taper cross-section can be formed in an organic film.

In the third method for etching an organic film, the second gas preferably further includes a rare gas.

In this manner, the recess formed in the organic film can more definitely attain the forward taper cross-section, and a deposition film formed on inner walls of a reaction chamber can be reduced so as to reduce the frequency of cleaning the reaction chamber. Therefore, the reaction chamber can be kept in a stable state.

The first method for fabricating a semiconductor device of this invention comprises the steps of forming an organic film on a semiconductor substrate; forming, on the organic film, a mask pattern including an inorganic compound as a principal constituent; and forming a recess in the organic film by selectively etching the organic film by using the mask pattern and by using plasma generated from an etching gas containing a first gas including, as a principal constituent, a compound including carbon, hydrogen and nitrogen and a second gas including a nitrogen component.

In the first method for fabricating a semiconductor device, a recess is formed in an organic film by the first method for etching an organic film, and hence, the recess can be formed in the organic film in a section not in a bowing shape but in a forward tapered shape. Therefore, a barrier layer can be uniformly formed on the wall of the recess without having a separated portion, and hence, the recess can be definitely filled with a conducting film. Accordingly, a connection plug or a buried interconnect with a good electric characteristic can be formed. Furthermore, since the etching gas includes the nitrogen component for supplying N ions to the plasma, the angle of the forward taper cross-section of the recess can be controlled by adjusting the mixing ratio of the nitrogen component.

Accordingly, in the first method for fabricating a semiconductor device, since a recess can be definitely filled with a conducting film, a connection plug or a buried interconnect with a good electric characteristic can be formed, and the angle of the forward taper cross-section of the recess can be controlled.

In the first method for fabricating a semiconductor device, the second gas is preferably a nitrogen gas.

In this manner since N ions and $N_2$ ions can be supplied to the plasma, the angle of the forward taper cross-section of the recess can be easily controlled.

In the first method for fabricating a semiconductor device, the second gas is preferably a mixed gas including a nitrogen gas and a hydrogen gas.

In this manner, while keeping the controllability of the angle of the forward taper cross-section of the recess, the etching rate can be improved.

In the first method for fabricating a semiconductor device, the second gas is preferably an ammonia gas.

In this manner, the controllability of the angle of the forward taper cross-section of the recess and the improvement of the etching rate can be both realized.

In the first method for fabricating a semiconductor device, the second gas preferably further includes a rare gas.

In this manner, a deposition film formed on inner walls of a reaction chamber can be reduced, so as to reduce the frequency of cleaning the reaction chamber. Therefore, the reaction chamber can be kept in a stable state for a long period of time. Furthermore, the recess can more definitely attain the forward taper cross-section, resulting in forming a connection plug or a buried interconnect with a better electric characteristic.

The second method for fabricating a semiconductor device of this invention comprises the steps of forming an organic film on a semiconductor substrate; forming, on the organic film, a mask pattern including an inorganic compound as a principal constituent; and forming a recess in the organic film by selectively etching the organic film by using the mask pattern and by using plasma generated from an etching gas containing a first gas including, as a principal constituent, a compound including carbon, hydrogen and nitrogen and a second gas including a rare gas.

In the second method for fabricating a semiconductor device, since a recess is formed in an organic film by the second method for etching an organic film, the recess with a forward taper cross-section can be formed in the organic film. Therefore, a barrier layer can be uniformly formed on the wall of the recess without having a separated portion. Accordingly, the recess can be definitely filled with a conducting film, and hence, a connection plug or a buried interconnect with a good electric characteristic can be formed. Furthermore, a deposition film formed on inner walls of a reaction chamber can be reduced, so as to reduce the frequency of cleaning the reaction chamber. Therefore, the reaction chamber can be kept in a stable state.

Accordingly, in the second method for fabricating a semiconductor device, since a recess can be definitely filled with a conducting film, a connection plug or a buried interconnect with a good electric characteristic can be formed, and a deposition formed on inner walls of a reaction chamber can be reduced so as to keep the reaction chamber in a stable state.

The third method for fabricating a semiconductor device of this invention comprises the steps of forming an organic film on a semiconductor substrate; forming, on the organic film, a mask pattern including an inorganic compound as a principal constituent; and forming a recess in the organic film by selectively etching the organic film by using the mask pattern and by using plasma generated from an etching gas containing a first gas including, as a principal constituent, a compound including carbon, hydrogen and nitrogen and a second gas including an oxygen component.

In the third method for fabricating a semiconductor device, since a recess is formed in an organic film by the third method for etching an organic film, a recess with a forward taper cross-section can be formed in the organic film. Therefore, a barrier layer can be uniformly formed on the wall of the recess without having a separated portion. Accordingly, the recess can be definitely filled with a conducting film, and hence, a connection plug or a buried interconnect with a good electric characteristic can be formed. Furthermore, since the etching gas includes the oxygen component, the etching rate can be improved.

Accordingly, in the third method for fabricating a semiconductor device, since a recess can be definitely filled with a conducting film, a connection plug or a buried interconnect with a good electric characteristic can be formed, and the etching rate can be improved.

In the third method for fabricating a semiconductor device, the second gas preferably further includes a rare gas.

In this manner, a deposition film formed on inner walls of a reaction chamber can be reduced, so as to reduce the frequency of cleaning the reaction chamber. Therefore, the reaction chamber can be kept in a stable state. Furthermore, the recess can definitely attain a forward taper cross-section, so as to form a connection plug or a buried interconnect with a better electric characteristic.

In any of the first through third methods of fabricating a semiconductor device, the recess preferably includes a via hole and an interconnect groove formed above the via hole and is filled with a conducting film by a dual damascene method.

In this manner, not only a barrier layer can be uniformly formed on the walls of the via hole and the interconnect groove without having a separated portion (disconnected portion) but also a crown-shaped barrier wall can be prevented from being formed on the bottom of the via hole. Therefore, the via hole and the interconnect groove can be definitely filled with the conducting film. Accordingly, the electric characteristics of a connection plug filled in the via hole and a metal interconnect filled in the interconnect groove can be improved, and a connection failure between the connection plug and a lower metal interconnect can be avoided. As a result, a multi-level interconnect structure with a good electric characteristic can be formed by the dual damascene method.

The first pattern formation method for this invention comprises the steps of forming an organic film on a substrate; forming, on the organic film, a mask layer including an inorganic component; and forming an organic film pattern from the organic film by selectively etching the organic film by using the mask layer and by using plasma generated from an etching gas including a first gas containing, as a principal constituent, a compound including carbon, hydrogen and nitrogen and a second gas including a nitrogen component.

In the first pattern formation method, an opening is formed in the organic film by the first method for etching an organic film. Therefore, while keeping a substantially constant etching rate, an opening with a forward taper cross-section can be formed in the organic film. Specifically, the opening of the organic film pattern never has a cross-section in a bowing shape, and hence, an etch target film can be precisely etched with a large process margin.

Accordingly, in the first pattern formation method, since an opening with a forward taper cross-section can be formed in an organic film, an etch target film can be precisely etched with a large process margin, and an organic film pattern can be formed in a substantially constant etching rate.

In the first pattern formation method, the second gas is preferably a nitrogen gas.

In this manner, since N ions and $N_2$ ions can be supplied to the plasma, the angle of the forward taper cross-section of the opening formed in the organic film can be easily controlled.

In the first pattern formation method, the second gas is preferably a mixed gas including a nitrogen gas and a hydrogen gas.

In this manner, while keeping the controllability of the angle of the forward taper cross-section of the opening, the etching rate can be improved.

In the first pattern formation method, the second gas is preferably an ammonia gas.

In this manner, the controllability of the angle of the forward taper cross-section of the opening and the improvement of the etching rate can be both realized.

In the first pattern formation method, the second gas preferably further includes a rare gas.

In this manner, a deposition film formed on inner walls of a reaction chamber can be reduced, so as to reduce the frequency of cleaning the reaction chamber. Therefore, the reaction chamber can be kept in a stable state. Furthermore, the opening formed in the organic film can more definitely attain a forward taper cross-section, so as to etch an etch target film more precisely with a larger process margin.

The second pattern formation method for this invention comprises the steps of forming an organic film on a substrate; forming, on the organic film, a mask layer including an inorganic component; and forming an organic film pattern from the organic film by selectively etching the organic film by using the mask layer and by using plasma generated from an etching gas containing a first gas including, as a principal constituent, a compound including carbon, hydrogen and nitrogen and a second gas including a rare gas.

In the second pattern formation method, since an opening is formed in the organic film by the second method for etching an organic film, an opening with a forward taper cross-section can be formed in the organic film, and hence, the opening of an organic film pattern can be prevented from having a cross-section in a bowing shape. Accordingly, an etch target film can be precisely etched with a large process margin. Furthermore, since a deposition film formed on inner walls of a reaction chamber can be reduced, the frequency of cleaning the reaction chamber can be reduced, so as to keep the reaction chamber in a stable state.

Accordingly, in the second pattern formation method, since an opening with a forward taper cross-section can be formed in an organic film, an etch target film can be precisely etched with a large process margin, and a deposition film formed on inner walls of a reaction chamber can be reduced so as to keep the reaction chamber in a stable state.

The third pattern formation method for this invention comprises the steps of forming an organic film on a substrate; forming, on the organic film, a mask layer including an inorganic component; and forming an organic film pattern from the organic film by selectively etching the organic film by using the mask layer and by using plasma generated from an etching gas containing a first gas including, as a principal constituent, a compound including carbon, hydrogen and nitrogen and a second gas including an oxygen component.

In the third pattern formation method, an opening is formed in the organic film by the third method for etching an organic film. Therefore, an opening with a forward taper cross-section can be formed in the organic film, and the opening of an organic film pattern can be prevented from having a cross-section in a bowing shape. Accordingly, an etch target film can be precisely etched with a large process margin. Furthermore, since the etching gas includes the oxygen component, the etching rate in forming the organic film pattern can be improved.

Accordingly, in the third pattern formation method, since an opening with a forward taper cross-section can be formed in an organic film, an etch target film can be precisely etched with a large process margin, and the etching rate in forming an organic film pattern can be improved.

In the third pattern formation method, the second gas preferably further includes a rare gas.

In this manner, a deposition film formed on inner walls of a reaction chamber can be reduced, so as to reduce the frequency of cleaning the reaction chamber. Therefore, the reaction chamber can be kept in a stable state. Furthermore, an opening formed in an organic film can more definitely attain a forward taper cross-section, so as to etch an etch target film more precisely with a larger process margin.

In any of the first through third pattern formation methods, the mask layer is preferably a silylated layer.

In this manner, an opening with a forward taper cross-section can be formed in an organic film pattern by a top surface imaging process.

BRIEF DESCRIPTION OF THE DRAWINGS

FIGS. 7A and 7B are schematic cross-sectional views of a plasma etching system used in a method for etching an organic film according to any embodiment of the invention, wherein FIG. 7A shows a state after conducting the method for etching an organic film according to any of Embodiment 1 through 3 and FIG. 7B shows a state after conducting a method for etching an organic film according to Embodiment 4 of the invention;

FIGS. 16A, 16B, 16C and 16D are cross-sectional SEM photographs of holes formed by a conventional method for etching an organic film;

DETAILED DESCRIPTION OF THE INVENTION

Embodiment 1

A method for etching an organic film according to Embodiment 1 of the invention will now be described with reference to FIGS. 1A through 1F, 2A, 2B and 3.

In the method for etching an organic film of Embodiment 1, a mixed gas including methylamine ($CH_3NH_2$) and nitrogen ($N_2$) is used as an etching gas so as to etch an organic film with plasma generated from the mixed gas. Exemplified etching conditions in Embodiment 1 are:

Plasma etching system: NLD plasma etching system

Type of etching gas and flow rates per minute in standard condition:

$CH_3NH_2:N_2=x$ ml:(100−$x$) ml

Antenna power: 1000 W (13.56 MHz)

Bias power: 200 W (2 MHz)

Pressure: 0.4 Pa

Substrate cooling temperature: 0° C.

Etching time: 180 seconds

Figure 1A:
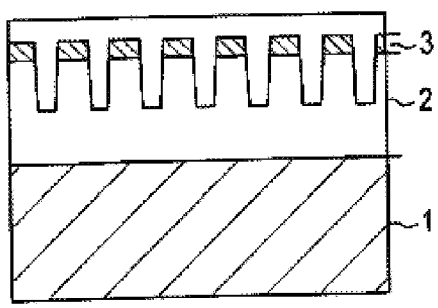
FIG. 1A is a schematic cross-sectional view of a hole formed by a method for etching an organic film according to Embodiment 1 of the invention.
Figure 1D:
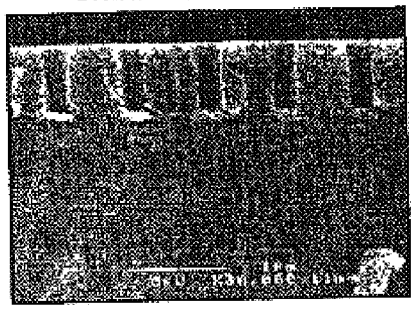
FIGS. 1B, 1C, 1D, 1E and 1F are cross-sectional SEM photographs of holes formed by the method for etching an organic film of Embodiment 1.

FIG. 1A shows a schematic sectional structure of a hole formed by the method for etching an organic film of this embodiment, and FIGS. 1B through 1F are cross-sectional SEM photographs of holes formed by the etching method for this embodiment. In FIGS. 1A through 1F, a reference numeral 1 denotes a silicon substrate, a reference numeral 2 denotes an organic film to be etched, and a reference numeral 3 denotes a mask pattern of a silicon oxide film. Furthermore, in FIGS. 1B through 1F, the ratios in the flow rate (ml) per minute in the standard condition between the methylamine gas and the nitrogen gas included in the etching gas, namely, $CH_3NH_2:N_2$, are 100 ml:0 ml, 70 ml:30 ml, 50 ml:50 ml, 30 ml:70 ml and 0 ml:100 ml, respectively. At the beginning of the etching, a resist pattern with a thickness of approximately 0.4 $\mu$m is formed on the mask pattern 3, and the resist pattern is eliminated during the etching of the organic film 2, although the resist pattern remains in the case shown in FIG. 1F.

In a pattern formation method for Embodiment 1, the organic film 2 has a thickness of approximately 1.2 $\mu$m, the mask pattern 3 has a thickness of approximately 240 nm and the hole has a diameter of 0.24 $\mu$m.

As is obvious from FIGS. 1B through 1F, when x is 50 through 100 ml, namely, when the mixing ratio of the methylamine gas is approximately 50% or more, the angle of a forward taper cross-section of the hole can be adjusted to a desired value by changing the mixing ratio of the nitrogen gas.

In general, an organic film includes, as a principal constituent, a polymer consisting of carbon atoms and hydrogen atoms, and the organic film is etched by nitrogen or hydrogen radicals and ions reaching the organic film as in Conventional Example 1. Therefore, it seems that a principal reaction product generated in the etching is volatile HCN and that the etching is proceeded by releasing the HCN from the etch target surface.

Furthermore, in conducting anisotropic etching by using plasma, the etching is mainly realized by proceeding an ion assisted etching reaction, and is minimally proceeded by chemical sputtering, physical sputtering and a thermochemical reaction as compared with the ion assisted etching reaction. In the ion assisted reaction, when ions are released from the plasma to reach an etch target film, the ions are accelerated by an electric field of a plasma sheath region formed between a plasma generation region and the etch target film so as to collide with the etch target film, resulting in proceeding a surface chemical reaction in the vicinity of collision portions by collision energy. The mechanism of the etching through the ion assisted reaction is roughly divided into the following two types:

(First Etching Mechanism)

In the first mechanism, reactive radicals participating in the etching reaction are physically or chemically adsorbed onto the etch target surface, and this mechanism is further classified into the following three cases:

In the first case, ions collide with the vicinity of the portion where the radicals are adsorbed, so as to cause a chemical reaction among the ions, the adsorbed substance and the material of the etch target film.

In the second case, the adsorption is further proceeded so as to form a thin deposition film on the etch target surface, and also in this case, the ion assisted reaction can be efficiently proceeded through the ion collision, so as to attain a high etching rate.

In the third case, the deposition film has a large thickness, and in this case, most of ions reaching the etch target surface are consumed in removing the deposition film, and hence, the etching rate is excessively lowered. Also, when the thickness of the deposition film is larger than a predetermined value, namely, too large to remove through the ion collision, the deposition film cannot be removed by the ions. Therefore, the chemical reaction among the ions reaching the etch target surface, the adsorbed substance and the material of the etch target film is terminated, resulting in stopping the etching.

(Second Etching Mechanism)

In the second mechanism, no reactive radicals participating in the etching reaction is adsorbed onto the etch target surface. In this case, ions collide with the etch target surface and cause a chemical reaction with the material of the etch target film directly by the energy of the ions themselves, so as to proceed the ion assisted etching reaction.

Figure 2A:
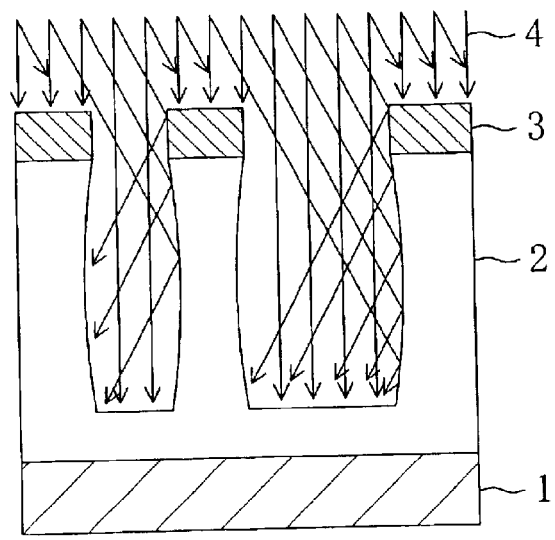
FIG. 2A is a diagram for explaining the mechanism of a conventional method for etching an organic film and FIG. 2B is a diagram for explaining the mechanism of the method for etching an organic film of Embodiment 1.
Figure 2B:
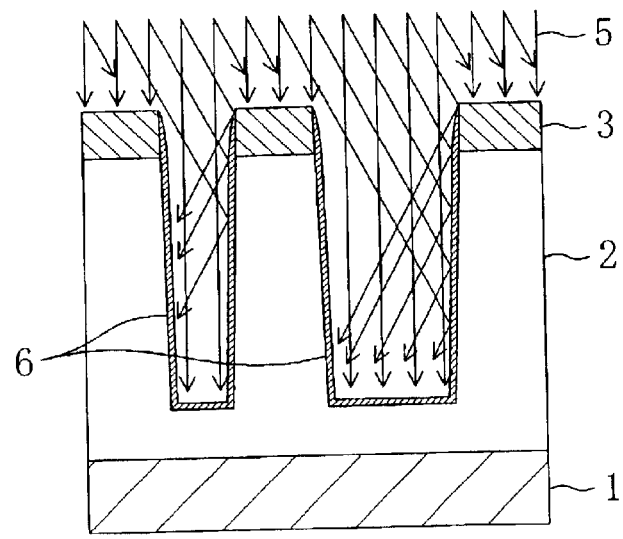

FIGS. 2A and 2B are diagrams for explaining an effect of the etching method for Embodiment 1, wherein FIG. 2A shows the etching mechanism attained by using a conventional etching gas, namely, a mixed gas including $N_2$ and $H_2$ or a $NH_3$ gas, and FIG. 2B shows the etching mechanism attained by using the etching gas of Embodiment 1, namely, the mixed gas including $CH_3NH_2$ and $N_2$.

In FIGS. 2A and 2B, a reference numeral 1 denotes a silicon substrate, a reference numeral 2 denotes an organic film to be etched, a reference numeral 3 denotes a mask pattern of a silicon oxide film, reference numerals 4 and 5 denote radicals (radical flux; hereinafter, reactive neutral particles with activity including atoms are generally designated as radicals), and a reference numeral 6 denotes a deposition film deposited on the wall and the bottom of a recess formed in the organic film 2 through the etching.

The radicals 4 and 5 are electrically neutral particles and hence isotropically reach the silicon substrate 1 from the plasma. In the drawings, arrows show part of the radicals 4 and 5. On the other hand, ions accelerated in the plasma sheath region to reach the silicon substrate 1 vertically reach the silicon substrate 1.

In the case where the plasma of the mixed gas including $N_2$ and $H_2$ (namely, in the case of FIG. 2A), generated radicals are considered to be N, $N_2$, H and $H_2$, and in the case where the plasma of a $NH_3$ gas is used, generated radicals are considered to be not only N, $N_2$, H and $H_2$ but also NH, $NH_2$ and $NH_3$. Therefore, when the $NH_3$ gas is used, the amount of generated radicals is larger as compared with the case where the mixed gas of $N_2$ and $H_2$ is used, and hence, the amount of substances adhered onto the etch target surface seems to be considerably increased.

However, a deposition with a thickness resistant to the collision of ions emitted from the plasma to the etch target surface is difficult to form from the aforementioned radicals.

Accordingly, the etching reaction occurring on the etch target surface on the bottom of the recess is probably dominantly a reaction to etch a small amount of atoms or molecules adhered onto the etch target surface and atoms present on the surface of the organic film by the ion assisted reaction caused by the ions emitted from the plasma (by the mechanism of the first case of the first etching mechanism), or an etching reaction between the ions and the etch target surface (by the second etching mechanism). In particular, in the etching by using the conventional plasma of $N_2$ and $H_2$, the etching is probably dominantly proceeded by the second etching mechanism.

Since a hydrogen ion is small in its atomic radius and inertial mass, it probably enters the inside of the organic film without causing a reaction when it reaches the etch target surface. Therefore, it seems that nitrogen ions and ions of ammonia fragments (molecules and atoms generated through dissociation and decomposition from ammonia molecules) are the prime cause for proceeding the ion assisted reaction.

When the plasma of the mixed gas including $CH_3NH_2$ and $N_2$ is used as in Embodiment 1, radicals of not only N, $N_2$, H, $H_2$, NH, $NH_2$ and $NH_3$ but also C, CH, $CH_2$, $CH_3$, $CH_4$ and CN are produced. Specifically, Embodiment 1 is different from Conventional Example 1 in a first point that there exist radicals of $CH_x$ (wherein x is 1, 2 or 3). These radicals tend to form a polymer on the etch target surface, and hence, the deposition film 6 is formed on the etch target surface. The deposition film 6 with an appropriate thickness has a function as a surface reaction layer, so as to serve as the prime cause for efficiently causing the ion assisted reaction. Accordingly, the etching is proceeded by the mechanism of the second case of the first etching mechanism.

In Embodiment 1, most of the etching reaction is caused by the mechanism of the second case of the first etching mechanism, whereas a part of the etching reaction is caused by the second etching mechanism.

The etching gas of Embodiment 1 includes $CH_3NH_2$, that is, the molecules of carbon, hydrogen and nitrogen, differently from the etching gas used in Conventional Example 1. Therefore, the deposition film 6 can be formed on the wall and the bottom (etch target surface) of the recess, and hence, the atoms required for the etching reaction can be fixed on and supplied onto the etch target surface in the form of the deposition film 6. As a result, on the wall of the recess where the probability of direct collision of ions is very small, the deposition film 6 works as a sidewall protection film for inhibiting the ion assisted reaction, and therefore, the recess can be formed to have a forward taper cross-section.

Also, on the bottom of the recess where a large number of ions collide, the ion assisted reaction (of the second case of the first etching mechanism) is caused between the deposition film 6 formed on the bottom and the colliding ions, so as to efficiently proceed the etching. In other words, the etching is proceeded with the bottom area of the recess of the organic film 2 reduced correspondingly to the thickness of the deposition film 6, and therefore, the recess can be formed to have in a forward taper cross-section.

As described so far, the etching method for Embodiment 1 is fundamentally different from the etching method for Conventional Example 1 as follows: While the etching method for Conventional Example 1 is mainly caused by the second etching mechanism or the mechanism of the first case of the first etching mechanism, the etching method for Embodiment 1 is mainly caused by the mechanism of the second case of the first etching mechanism.

Now, the function of $N_2$ in the mixed gas of $CH_3NH_2$ and $N_2$ will be described.

Figure 1B:
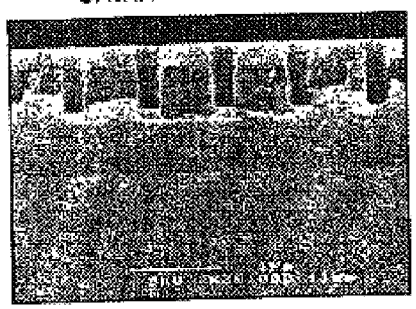
Figure 1E:
Figure 1C:
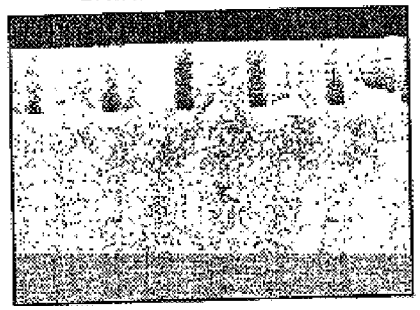
Figure 1F:
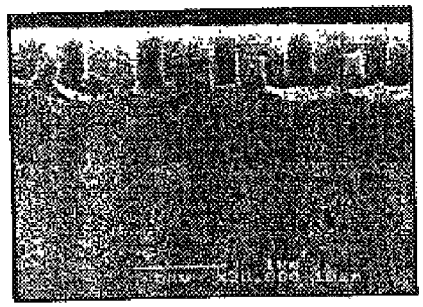

As described above, $CH_3NH_2$ has a function to supply the radicals of $CH_x$ (wherein x is 1, 2 or 3) onto an etch target surface so as to form a deposition film with an appropriate thickness on the etch target surface and the wall of a recess. On the other hand, $N_2$ has a function to supply N ions and $N_2$ ions serving as the prime cause of the ion assisted reaction. In other words, $N_2$ plays a role to supplement N ions and $N_2$ ions that are short in using an etching gas of $CH_3NH_2$ alone. As is shown in FIG. 1B, when the etching gas includes 100% of $CH_3NH_2$, the angle of the forward taper cross-section is large and the bottom of the recess is much smaller than the opening of the recess. When an appropriate amount of $N_2$ is mixed, however, the taper angle can be controlled. Now, two effects attained by mixing $N_2$ with $CH_3NH_2$ will be described.

As the first effect, the composition ratio, namely, C:H:N, of the etching gas used for generating plasma is changed, so as to change the radical ratio between $CH_x$ and N and the radical ratio between $CH_x$ and $N_2$ generated in the plasma. Specifically, the ratio of radicals of the nitrogen family is increased and the ratio of ions of the nitrogen family is increased.

As the second effect, the total amount of the $CH_x$ radicals, that is, the prime cause for forming the deposition film 6, is decreased, and the amount of the radicals and ions of the nitrogen family for removing the deposition film is increased. Owing to the synergetic effect, the thickness of the deposition film formed on the wall of the recess is decreased on a time average basis. As a result, the taper angle is reduced, so that the cross-section of the recess becomes more vertical.

When the $CH_3NH_2$ gas and the $N_2$ gas can be independently supplied in Embodiment 1, the total flow rate of the etching gas and the mixing ratio of the $N_2$ gas can be independently controlled. As a result, the taper angle can be minutely controlled.

Figure 3:
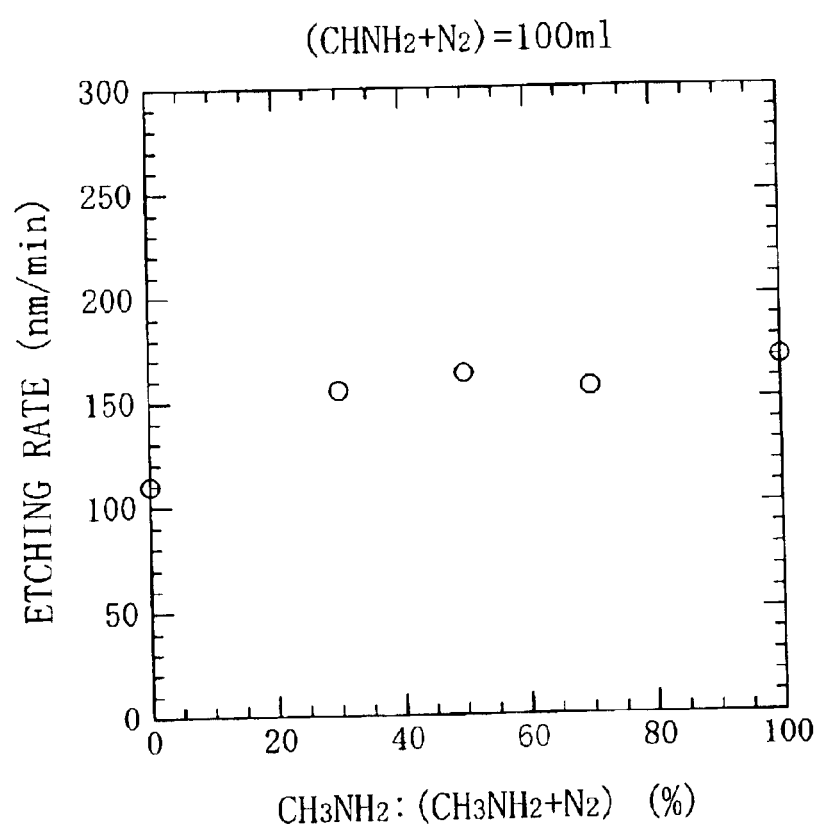
FIG. 3 is a diagram for showing the relationship between a mixing ratio of $CH_3NH_2$ in an etching gas and the etching rate of an organic film in the method for etching an organic film of Embodiment 1.

FIG. 3 shows the relationship between the mixing ratio of $CH_3NH_2$ in the mixed gas of $CH_3NH_2$ and $N_2$ and the etching rate of the organic film. It is understood from FIG. 3 that the etching rate is minimally varied when the etching gas includes 30% or more of $CH_3NH_2$.

Accordingly, even when the angle of the taper cross-section is controlled by changing the mixing ratio of $CH_3NH_2$ in the mixed gas, a substantially constant etching rate can be attained. Therefore, the method for etching an organic film of Embodiment 1 is good in process controllability.

As described so far, according to the method for etching an organic film of Embodiment 1, a recess with a good forward taper cross-section can be formed in an organic film, and the angle of the forward taper cross-section can be controlled with keeping a substantially constant etching rate.

Embodiment 2

A method for etching an organic film according to Embodiment 2 of the invention will now be described with reference to FIGS. 4 and 5A through 5D.

In the method for etching an organic film of Embodiment 2, a mixed gas including methylamine, nitrogen and hydrogen is used as the etching gas so as to etch an organic film with plasma generated from the mixed gas. The etching conditions employed in Embodiment 2 are the same as those of Embodiment 1 except for the condition for the etching gas, and hence, the condition for the etching gas alone will be herein described.

Type of etching gas and flow rates per minute in standard condition:

$$(CH_3NH_2+N_2):H_2 = x \text{ ml}:(100-x) \text{ ml}$$

Figure 4:
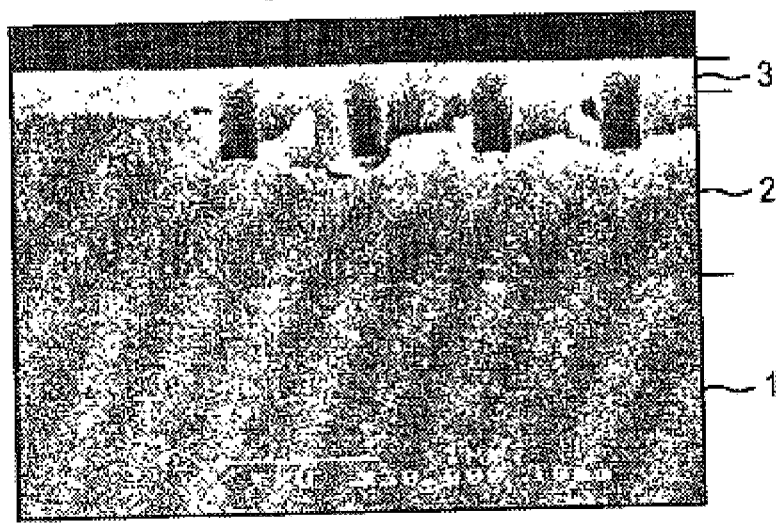
FIG. 4 is a cross-sectional SEM photograph of a hole formed by a method for etching an organic film according to Embodiment 2 of the invention.

FIG. 4 is a cross-sectional SEM photograph of holes formed with the ratio in the flow rate (ml) per minute in the standard condition between the methylamine gas and the hydrogen gas included in the etching gas, namely, $CH_3NH_2:H_2$, set to 30 ml:70 ml. In FIG. 4, a reference numeral 1 denotes a silicon substrate, a reference numeral 2 denotes an organic film to be etched and a reference numeral 3 denotes a mask pattern of a silicon oxide film.

As is understood from FIG. 4, a hole with a forward taper cross-section can be obtained even when the etching gas includes 50% or more of hydrogen.

Accordingly, a hole with a forward taper cross-section can be obtained similarly to Embodiment 1 even when the mixed gas including methylamine, nitrogen and hydrogen is used as the etching gas.

Now, the basis of the mechanism in etching an organic film will be described again.

In etching an organic film, the etching reaction is proceeded by changing carbon and hydrogen included in the organic film into a volatile compound through the ion assisted reaction and allowing the generated volatile compound to release from an etch target surface so as to discharge the released volatile compound.

For example, carbon produces a volatile compound through a reaction, $C+H+N \rightarrow HCN\uparrow$, and hydrogen produces a volatile compound through a reaction, $H+H \rightarrow H_2\uparrow$.

It is particularly significant in etching an organic film how carbon is removed. As is understood from the above-described chemical formula, the etching reaction is the most efficiently proceeded when carbon, nitrogen and hydrogen are mixed so as to allow them to present on the etch target surface in a ratio of 1:1:1. Specifically, the etching rate can be maximized by optimizing the mixing ratios of nitrogen and hydrogen in the etching gas.

FIGS. 5A through 5D are diagrams for explaining an effect of the method for etching an organic film of Embodiment 2, for specifically showing the cross-sections of recesses formed by etching an organic film for the same time period.

Figure 5A:
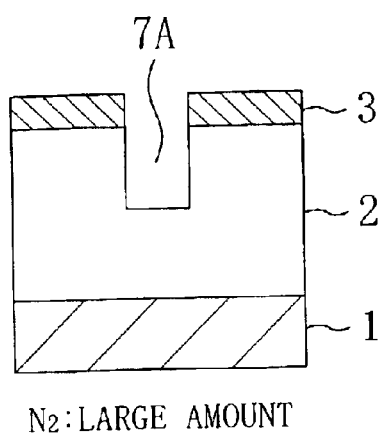
FIGS. 5A, 5B, 5C and 5D are cross-sectional views for explaining an effect of the method for etching an organic film of Embodiment 2.
Figure 5B:
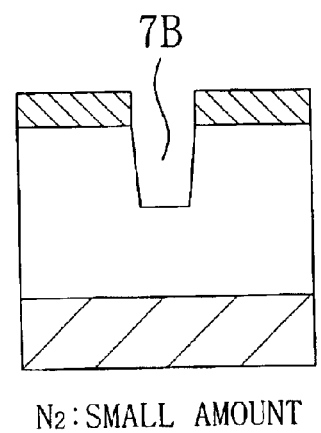

FIGS. 5A and 5B show the recesses obtained by conducting the etching with plasma generated from a $(CH_3NH_2+H_2)$ gas, wherein the mixing ratio of $N_2$ in the etching gas is large in FIG. 5A and small in FIG. 5B.

As described in Embodiment 1, the angle of the taper cross-section can be controlled by changing the mixing ratios of $CH_3NH_2$ and $N_2$ in the etching gas. When the mixing ratio of $N_2$ is large, a recess 7A having a substantially vertical cross-section not in a bowing shape can be obtained as is shown in FIG. 5A, and when the mixing ratio of $N_2$ is small, a recess 7B having a forward taper cross-section can be obtained as is shown in FIG. 5B.

Figure 5C:
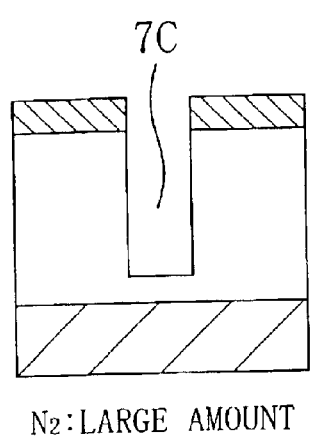
Figure 5D:
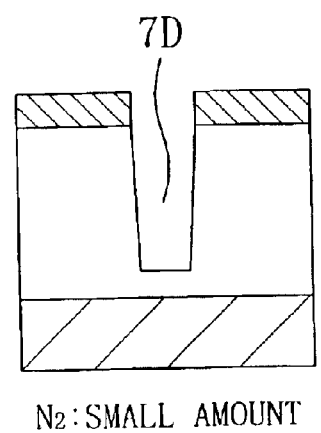

FIGS. 5C and 5D show the cross section of the recesses obtained by conducting the etching with plasma generated from a $(CH_3NH_2+N_2+H_2)$ gas, wherein FIG. 5C shows the cross-section of a recess 7C formed when the mixing ratio of $N_2$ is large in the etching gas and FIG. 5D shows the cross-section of a recess 7D formed when the mixing ratio of $N_2$ is small in the etching gas.

When the $CH_3NH_2$ gas, the $N_2$ gas and the $H_2$ gas can be independently supplied in the method for etching an organic film of Embodiment 2, the total flow rate of the etching gas and the mixing ratios of $CH_3NH_2$, $N_2$ and $H_2$ in the etching gas can be independently controlled. Accordingly, the amounts of CH$_x$, N and H supplied onto an etch target surface can be adjusted to a ratio for causing the etching reaction most efficiently.

As is shown in FIGS. 5C and 5D, while keeping the controllability on the taper angle attained in Embodiment 1, the etching conditions can be easily optimized so as to improve the etching rate.

Since the angle of the taper cross-section is not changed even when a large amount of H$_2$ is mixed in the etching gas as described above, it is understood that the factor affecting the taper cross-section is N$_2$ also when the etching is carried out with the plasma generated from the (CH$_3$NH$_2$+N$_2$+H$_2$) gas as in Embodiment 2. Accordingly, it can be confirmed that the mechanism for controlling the taper cross-section described in Embodiment 1 is correct.

As described above, since a hydrogen ion is small in its atomic radius and inertial mass, most of hydrogen ions enter the inside of the organic film without remaining on the surface of the organic film when there is no deposition film on the etch target surface. When there is a deposition film on the etch target surface, however, the hydrogen ions collide with the deposition film, so as to increase the hydrogen concentration within the deposition film and in the vicinity of the etch target surface corresponding to the interface between the deposition film and the organic film. Accordingly, the hydrogen concentration on the etch target surface can be controlled by adjusting the mixing ratio of hydrogen in the etching gas.

It is noted that the (CH$_3$NH$_2$+N$_2$) gas is used as the base of the etching gas in Embodiment 2. Specifically, the effect attained by adding the H$_2$ gas can be exhibited when the mixing ratio of the (CH$_3$NH$_2$+N$_2$) gas is 50% or more in the etching gas.

As described so far, according to Embodiment 2, the (CH$_3$NH$_2$+N$_2$+H$_2$) gas is used, the angle of a taper cross-section is controlled owing to the N$_2$ gas by controlling the mixing ratios of CH$_3$NH$_2$, N$_2$ and H$_2$, and the etching rate is improved owing to the H$_2$ gas.

Embodiment 3

A method for etching an organic film according to Embodiment 3 of the invention will now be described with reference to FIGS. 6A and 6B.

In the method for etching an organic film of Embodiment 3, a mixed gas including methylamine and ammonia (NH$_3$) is used as the etching gas, so as to etch an organic film with plasma generated from the mixed gas. The etching conditions employed in Embodiment 3 are the same as those of Embodiment 1 except for the condition for the etching gas, and hence, the condition for the etching gas alone will be herein described.

Type of etching gas and flow rates per minute in standard condition:

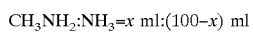

CH$_3$NH$_2$:NH$_3$=$x$ ml:(100–$x$) ml

Figure 6A:
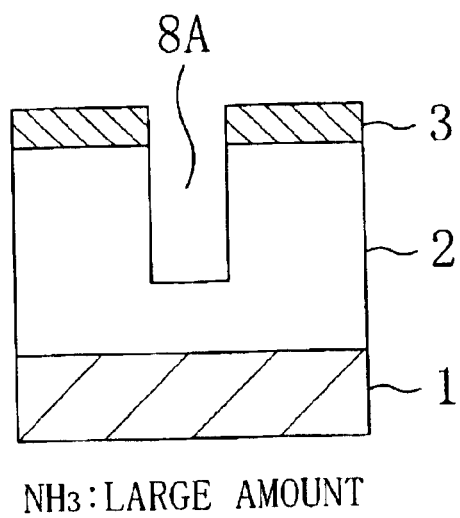
FIGS. 6A and 6B are cross-sectional views for explaining an effect of a method for etching an organic film according to Embodiment 3 of the invention.
Figure 6B:
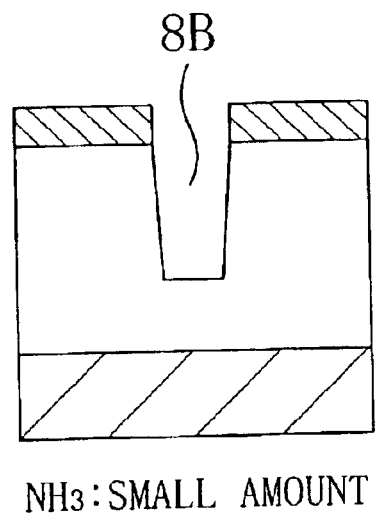

FIGS. 6A and 6B show cross-sections of holes formed by conducting the etching with the plasma generated from the (CH$_3$NH$_2$+NH$_3$) gas, wherein FIG. 6A shows the cross-section of a recess 8A formed when the mixing ratio of NH$_3$ is large in the etching gas and FIG. 6B shows the cross-section of a recess 8B formed when the mixing ratio of NH$_3$ is small in the etching gas.

According to the method for etching an organic film of Embodiment 3, although the mixing ratios of N$_2$ and H$_2$ cannot be individually adjusted, the mixing ratio of nitrogen can be adjusted by controlling the mixing ratio of NH$_3$. Accordingly, the angle of a taper cross-section can be controlled. Also, the mixing ratio of hydrogen can be simultaneously adjusted although the adjustment depends upon the adjustment for nitrogen, the etching rate can be improved.

Embodiment 4

A method for etching an organic film according to Embodiment 4 of the invention will now be described with reference to FIGS. 7A and 7B.

In the method for etching an organic film of Embodiment 4, a mixed gas including methylamine, nitrogen and argon is used as the etching gas, so as to etch an organic film with plasma generated from the mixed gas. The etching conditions employed in Embodiment 4 are the same as those of Embodiment 1 except for the condition for the etching gas, and hence, the condition for the etching gas alone will be herein described.

Type of etching gas and flow rates per minute in standard condition:

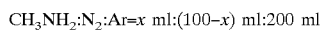

CH$_3$NH$_2$:N$_2$:Ar=$x$ ml:(100–$x$) ml:200 ml

Figure 7A:
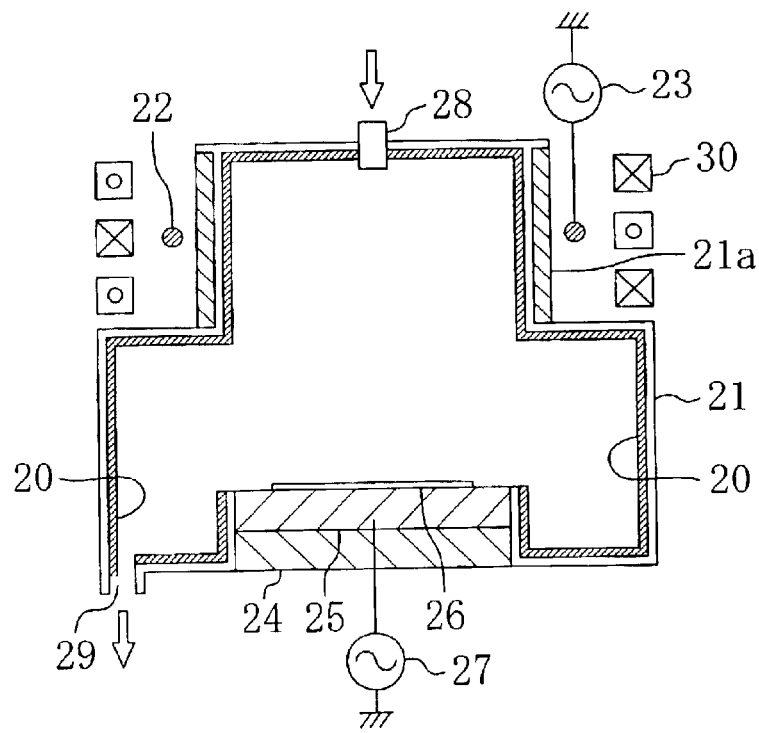
Figure 7B:
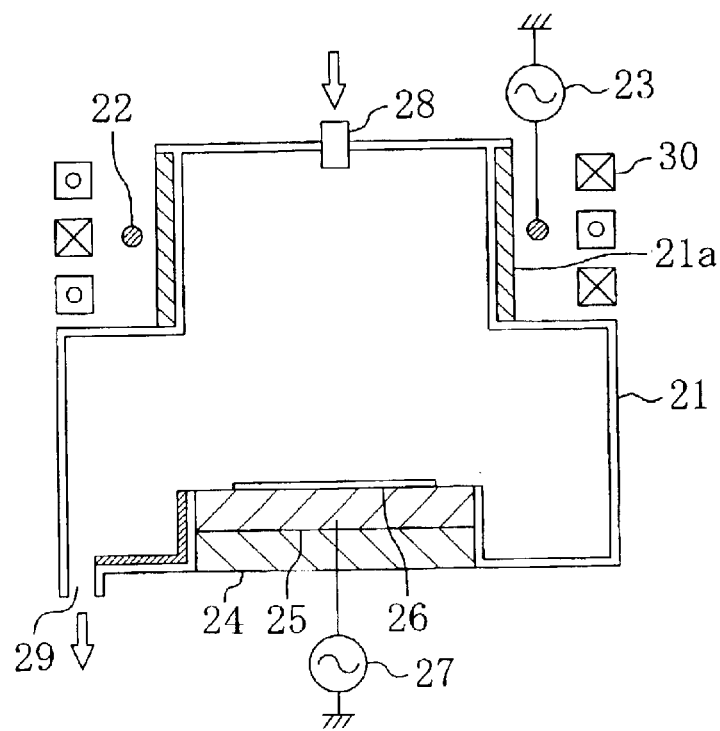

FIGS. 7A and 7B show the schematic cross-sectional structures of a plasma etching system (NLD plasma etching system) used in a method for etching an organic film, wherein FIG. 7A shows a state of the plasma etching system attained after conducting the etching method for any of Embodiments 1 through 3 for a long period of time and FIG. 7B shows a state of the plasma etching system attained after conducting the etching method for Embodiment 4 for a long period of time.

In FIGS. 7A and 7B, a reference numeral 21 denotes a reaction chamber in a cylindrical shape, and the upper portion of the reaction chamber 21 is covered with a quartz tube 21$a$ in a cylindrical shape. A reference numeral 22 denotes an inductive coupling coil made from one loop-shaped coil. A reference numeral 23 denotes an RF generator for exciting the inductive coupling coil 22 to generate plasma through inductive coupling. A reference numeral 24 denotes an insulator, and a reference numeral 25 denotes a lower electrode, which holds a wafer 26. A reference numeral 27 denotes a low frequency generator for supplying electromagnetic waves of a frequency ranging between a low frequency and a medium frequency, and for example, supplies electromagnetic waves of a frequency of approximately 800 kHz through 2 MHz. The electromagnetic waves generated by the low frequency generator 27 are applied to the lower electrode 25 through the insulator 24. Also, the insulator 24 electrically insulates the lower electrode 25 and is connected to the reaction chamber 21 through a vacuum seal so as to keep the reaction chamber 21 in a vacuum. A reference numeral 28 denotes a gas inlet for supplying a gas serving as a principal constituent of plasma to be generated. A reference numeral 29 denotes a gas outlet for exhausting the gas so as to keep the reaction chamber 21 at a constant pressure. A reference numeral 30 denotes a magnetic coil for generating a magnetic neutral loop.

When the method for etching an organic film according to any of Embodiments 1 through 3 is carried out for a long period of time, a deposition film 20 including, as principal constituents, a reaction product and a gas included in the plasma is formed on the inner walls of the reaction chamber 21 as is shown in FIG. 7A. On the contrary, when the method for etching an organic film of Embodiment 4, namely, the etching method using the etching gas including argon, is carried out for a long period of time, the deposition film 20 is minimally formed on the inner walls of the reaction chamber 21 as is shown in FIG. 7B.

When the deposition film 20 is formed on the inner walls of the reaction chamber 21, there arises a problem that a large amount of particles are produced. Therefore, the following countermeasure is employed:

After etching for a predetermined time period, the deposition film 20 is removed by plasma cleaning mainly using oxygen, and thereafter, it is necessary to adjust the inner walls of the reaction chamber 21 by conducting dummy discharge by using the same plasma used for the desired etching. In this manner, the inside of the reaction chamber 21 can be kept in a state necessary for the plasma etching for a given time period.

Also, in the case where the amount of produced particles cannot be reduced by the plasma cleaning, the reaction chamber 21 is opened to the air to be cleaned with an organic solvent such as alcohol.

Accordingly, as the amount of the deposition film 20 adhered onto the inner walls of the reaction chamber 21 is smaller, the frequency of conducting the cleaning can be reduced so as to keep the reaction chamber 21 in a stable state for a longer period of time. Therefore, an etching method in which the amount of the deposition film 20 is smaller is very useful in the fabrication process for semiconductor devices.

When Ar is added, as in Embodiment 4, to the etching gas of Embodiment 1 in a flow rate half or more of the total flow rate of the etching gas, the amount of the deposition film 20 can be largely reduced.

Now, the reason why the amount of the deposition film 20 can be largely reduced in Embodiment 4 will be described.

First, this is because the partial pressure of the etching gas ($CH_3NH_2+N_2$) within the reaction chamber 21 and the partial pressure of a gas dissociated and generated from the etching gas are lowered.

Second, this is because residence time in which the generated gas exists within the reaction chamber 21 (which is in proportion to the pressure and the volume of the reaction chamber 21 and is in inverse proportion to the gas flow rate) is decreased, so that the gas participating in the increase of the deposition film can be efficiently exhausted.

While the inner walls of the reaction chamber 21 are in contact with subtle plasma, the semiconductor wafer 26 to be etched is in contact with dense plasma where an etching reaction product is produced by the plasma. Therefore, the etching characteristic is not largely spoiled even when Ar is added. Also, Ar plays a role to accelerate the ion assisted reaction on the etch target surface similarly to the nitrogen ions.

Accordingly, the amount of the deposition film formed on the inner walls of the reaction chamber 21 can be decreased without spoiling the etching characteristic in Embodiment 4.

Although Ar is added to the etching gas in Embodiment 4, the same effect can be attained by adding one of or a combination of other rare gases such as He, Ne, Xe, Kr and Rn instead of Ar.

Also, although the rare gas is added to the ($CH_3NH_2+N_2$) gas in Embodiment 4, the same effect can be attained by adding the rare gas to any gas capable of etching an organic film, such as a ($N_2+H_2$) gas, a $NH_3$ gas, a ($CH_3NH_2+N_2+H_2$) gas and a ($CH_3NH_2+NH_3$) gas.

Embodiment 5

A method for etching an organic film according to Embodiment 5 of the invention will now be described with reference to FIGS. 8 and 9A through 9D.

In the method for etching an organic film of Embodiment 5, a mixed gas including methylamine and oxygen is used as the etching gas, so as to etch an organic film with plasma generated from the mixed gas. The etching conditions employed in Embodiment 5 are the same as those of Embodiment 1 except for the condition for the etching gas, and hence, the condition for the etching gas alone will be herein described.

Type of etching gas and flow rates per minute in standard condition:

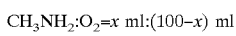

$CH_3NH_2:O_2=x$ ml:$(100-x)$ ml

Figure 8:
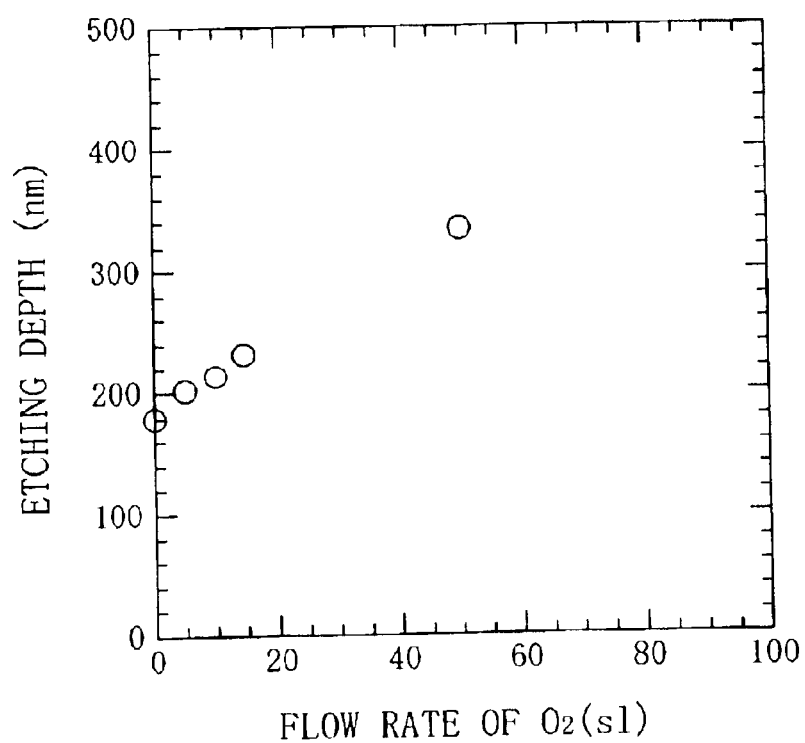
FIG. 8 is a diagram for showing the relationship between the amount of oxygen added to an etching gas and an etching depth in a method for etching an organic film according to Embodiment 5 of the invention.

FIG. 8 is a diagram for explaining an effect attained in etching an organic film by adding the oxygen gas to the etching gas, and shows the relationship between the amount of $O_2$ added and the etching depth attained by conducting the etching for 180 seconds. As is understood from FIG. 8, when $O_2$ is added to the etching gas, the etching depth, namely, the etching rate, can be increased.

FIGS. 9A through 9D show cross-sections of recesses formed by etching an organic film for the same time period.

Figure 9A:
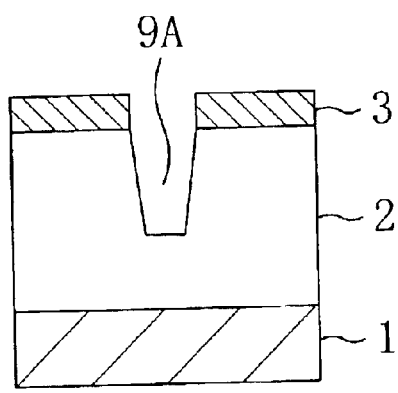
FIGS. 9A, 9B, 9C and 9D are cross-sectional views for explaining an effect of the method for etching an organic film of Embodiment 5.
Figure 9B:
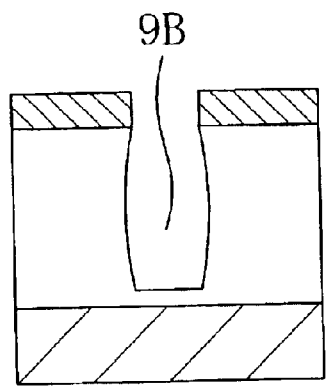

FIG. 9A shows the cross-section of a recess 9A formed when the etching is conducted with plasma generated from a $CH_3NH_2$ gas, and FIG. 9B shows the cross-section of a recess 9B formed when the etching is conducted with plasma generated from an $O_2$ gas.

As is understood from FIG. 9A, when 100% of the etching gas is $CH_3NH_2$, the cross-section of the recess 9A is in a forward taper shape but the etching rate is not very large. Also, as is understood from FIG. 9B, when 100% of the etching gas is $O_2$, the etching rate is large but the cross-section of the recess 9B is in a bowing shape.

Accordingly, when the etching gas including both $CH_3NH_2$ and $O_2$ is used, the characteristics of both the gases can be attained. When the mixing ratio of either $CH_3NH_2$ or $O_2$ is increased, the characteristic of the gas with the large mixing ratio is conspicuously exhibited.

When merely a small amount of $O_2$ is added to the etching gas, the characteristic of $O_2$ can be exhibited. Therefore, the mixing ratio of the $CH_3NH_2$ gas in the etching gas is preferably approximately 80% or more. In this manner, a forward taper cross-section, that is, the etching characteristic of the $CH_3NH_2$ gas, and improvement of the etching rate, that is, the effect of adding $O_2$, can be both attained.

Figure 9C:
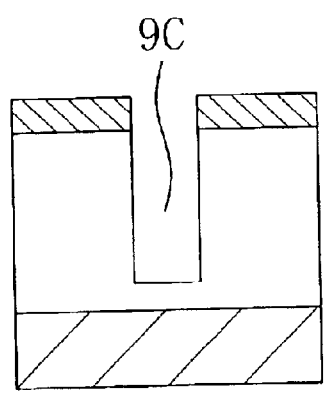
Figure 9D:
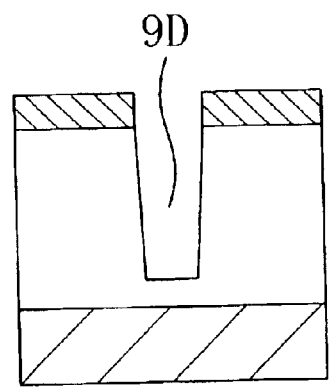

FIGS. 9C and 9D show the cross-sections of recesses formed by conducting the etching with plasma generated from the etching gas including the $CH_3NH_2$ gas and the $O_2$ gas, wherein FIG. 9C shows the cross-section of a recess 9C formed when the ratio of $O_2$ is relatively large in the etching gas and FIG. 9D shows the cross-section of a recess 9D formed when the ratio of $O_2$ is relatively small in the etching gas.

As is shown in FIG. 9C, when the ratio of $O_2$ is relatively large, the recess 9C has a substantially vertical cross-section. Also, as is shown in FIG. 9D, when the ratio of $O_2$ is relatively small, the recess 9D has a forward taper cross-section.

Since the etching gas obtained by adding the $O_2$ gas to the $CH_3NH_2$ gas is used in Embodiment 5, a recess with a forward taper cross-section and improvement of the etching rate can be simultaneously realized. When the amount of $O_2$ added is small, a recess has a more vertical cross-section and the improvement of the etching rate is suppressed. In contrast, when the amount of added $O_2$ is large, a recess has a forward taper cross-section and the etching rate is improved. Furthermore, the effect of adding $O_2$ is more remarkable as the diameter or width of the recess is smaller.

When the diameter or width of a recess is smaller than 0.25 μm, the aspect ratio of the recess is so high that the amount of radicals supplied to the inside of the recess is reduced as well as the amount of supplied ions is reduced. Accordingly, in the conventional etching method, the amount of ions for removing the deposition film formed on the etch target surface (the bottom of the recess in particular) is short, resulting in causing a problem of degradation of the etching rate.

In contrast, according to Embodiment 5, since $O_2$ added to the etching gas exhibits an ability to remove the deposition film so as to prevent the degradation of the etching rate, an effect to prevent increase of RIE lag can be also attained.

Also, $O_2$ added to the etching gas exhibits an effect to reduce the amount of the deposition film formed on the inner walls of the reaction chamber 21.

Embodiment 6

A method for etching an organic film according to Embodiment 6 of the invention will now be described with reference to FIGS. 10A and 10B.

In the method for etching an organic film of Embodiment 6, a mixed gas including methylamine, oxygen and argon is used as the etching gas, so as to etch an organic film with plasma generated from the mixed gas. The etching conditions employed in Embodiment 6 are the same as those of Embodiment 1 except for the condition for the etching gas, and hence, the condition for the etching gas alone will be herein described.

Type of etching gas and flow rates per minute in standard condition:

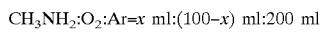

$CH_3NH_2:O_2:Ar=x$ ml:(100−x) ml:200 ml

Since Ar is added to the etching gas in Embodiment 6, a first effect to lower the growth rate of the deposition film formed on the inner walls of the reaction chamber can be attained as described in Embodiment 4, and a second effect to form a recess with a forward taper cross-section will now be described.

Figure 10A:
FIG. 10A is a cross-sectional SEM photograph of a hole formed by a method for etching an organic film according to Embodiment 6 of the invention and FIG. 10B is a diagram for explaining the mechanism of the method for etching an organic film of Embodiment 6.

FIG. 10A is a cross-sectional SEM photograph of holes formed when the ratio in flow rate (ml) per minute in the standard condition between methylamine and argon in the etching gas, namely, $CH_3NH_2$:Ar, is 30 ml:70 ml.

As is understood from FIG. 10A, although the mixing ratio of Ar in the etching gas is 70%, the cross-section of the hole is obviously in a forward taper shape. Also, as is understood from comparison between FIG. 1B and FIG. 10A, the angle of the forward taper cross-section is larger in FIG. 10A where Ar is added to $CH_3NH_2$ than in FIG. 1B where $CH_3NH_2$ alone is used. Accordingly, it is understood that the angle of the forward taper cross-section of a recess can be increased by adding Ar to $CH_3NH_2$.

Figure 10B:
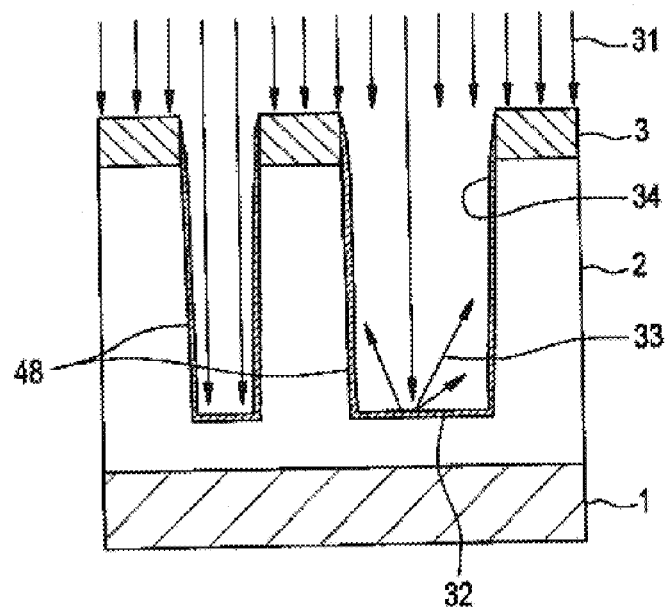

FIG. 10B shows etching mechanism obtained when the etching gas including $CH_3NH_2$ and Ar is used.

As is described in Embodiment 1, when plasma generated from the etching gas mainly including $CH_3NH_2$ is used, a deposition film including $CH_x$ (wherein x is 1, 2 or 3) as a principal constituent is formed on the wall and the bottom of a recess.

When Ar is added to the etching gas, however, the deposition film 32 formed on the bottom of the recess is sputtered by Ar ions 31, so as to sputter out a released substance 33. The released substance 33 is adhered onto the wall of the recess to work as a wall protection film 34 having a function to suppress the etching of the wall of the recess. Therefore, as compared with the case where Ar is not added to the etching gas, the thickness of the wall protection film 34 is increased.

The wall protection film 34 is also sputtered by the Ar ions 31, but a substance that is released again by this sputtering is adhered onto the wall or the bottom of the recess again. In this case, the probability of being irradiated with ions is much higher in the bottom than in the wall of the recess. Therefore, the effect that a part of the deposition formed on the bottom of the recess is released again by the sputtering to be adhered as the wall protection film 34 is more remarkably exhibited, and hence, the thickness of the wall protection film 34 is further increased.

As described so far, Ar added to the etching gas exhibits the effect to form a recess with a forward taper cross-section.

Accordingly, the controllability of plasma is largely improved in Embodiment 6 because $O_2$ that improves the etching rate but can undesirably form a recess with a cross-section in a bowing shape and Ar that can form a recess with a forward taper cross-section are mixed. In order to stably attain a forward taper cross-section, the amount of added $O_2$ is preferably approximately 20% or less.

Although Ar is added to the etching gas of Embodiment 5 in the above description, the same effect can be attained by adding Ar to the etching gas of Embodiment 4.

Furthermore, although Ar is added to the etching gas in Embodiment 6, the first effect can be attained by adding one of or a combination of He, Ne, Xe, Kr and Rn instead of Ar, and the second effect can be attained by adding one of or a combination of Ne, Xe, Kr and Rn instead of Ar. The second effect is difficult to attain by adding He because He is too small in its inertial mass to realize the sputtering effect.

Furthermore, although the rare gas is added to the $CH_3NH_2$ gas in Embodiment 6, the same effect can be attained by adding the rare gas to any gas capable of etching an organic film, such as a $(CH_3NH_2+N_2)$ gas, a $(N_2+H_2)$ gas, a $NH_3$ gas, a $(CH_3NH_2+N_2+H_2)$ gas and a $(CH_3NH_2+NH_3)$ gas.

Furthermore, as far as $CH_3NH_2$ is mixed in the etching gas in a flow rate sufficient for exhibiting the characteristic of $CH_3NH_2$, the effects described in Embodiments 1 through 6 can be attained even when another gas is mixed in the etching gas.

Although the gas including methylamine as a principal constituent is used as the etching gas in each of Embodiments 1 through 6, any other gas containing, as a principal constituent, a compound including carbon, hydrogen and nitrogen can be widely used instead. The same etching characteristic as that attained by methylamine can be attained by using, for example, one of or a combination of dimethylamine $((CH_3)_2NH)$, trimethylamine $((CH_3)_3N)$ and ethylamine $(C_2H_5NH_2)$. Methylamine, dimethylamine, trimethylamine and ethylamine can be very conveniently used because they can be taken out as a gas at a pressure of 1 atm and a temperature of 25° C. (room temperature). The boiling points at a pressure of 1 atm of methylamine, dimethylamine, trimethylamine and ethylamine are −6.3° C., +7.4° C., +2.9° C. and +16.6° C., respectively.

Alternatively, a gas principally including propylamine $(C_3H_7NH_2)$ may be used as the etching gas instead of the gas principally including methylamine. Since the boiling point of propylamine is 48.5° C., the temperature should be increased to approximately 50° C. or more in order to take out propylamine as a gas, and hence, propylamine is slightly less convenient. However, the same etching characteristic as that attained by methylamine can be attained when propylamine can be taken out to be supplied to a plasma reaction chamber.

Furthermore, the following gases can also be used to attain the same etching characteristic as that attained by methylamine if they can be taken out as a gas by any of currently practically used techniques (such as a heating technique): A gas of the nitrile family such as acetonitrile ($C_2H_3N$; having a boiling point at 1 atm of 81.8° C.); acrylonitrile ($C_3H_3N$; having a boiling point at 1 atm of 78.5° C.); and propionitrile ($C_3H_5N$; having a boiling point at 1 atm of 97.1° C.); a gas of the diamine family such as 1,2-ethanediamine ($C_2H_8N$; having a boiling point at 1 atm of 117.2° C.); and a gas including four or more carbon atoms such as $C_4H_5N$, $C_4H_7N$, $C_4H_{11}N$, $C_5H_7N$ and $C_5H_9N$ (having a boiling point at 1 atm of approximately 100° C. or more except for $C_4H_{11}N$ having a boiling point at 1 atm of 70° C. or less).

Apart from the aforementioned compounds, an example of the compound that can be easily taken out as a gas and can realize the same etching characteristic as that attained by methylamine is hydrogen cyanide (so-called hydrocyanic acid (HCN)). However, hydrogen cyanide is not preferred because it is virulently poisonous for human bodies.

As described so far, the most practically useful compounds including at least carbon, hydrogen and nitrogen are methylamine, dimethylamine, trimethylamine, ethylamine and propylamine.

Furthermore, a gas to be used in the plasma etching may be optimally selected basically depending upon the method and the system for exciting the plasma. As a plasma etching system can more highly excite the plasma, a higher molecular gas can be used, and hence, a gas to be used can be selected from a larger range. Specifically, when a plasma etching system capable of high excitement, such as an inductively coupled plasma etching system, a surface wave plasma etching system, an NLD plasma etching system, a capacity coupled parallel plate etching system using RF and an ECR plasma etching system, is used, a gas to be used can be selected in accordance with the actually used power (energy).

Also, the effects of this invention are described in each of Embodiments 1 through 6 on the basis of the result obtained by using the etching gas in the NLD plasma etching system. However, the method for etching an organic film of any of Embodiments 1 through 6 is applicable to use of any plasma etching system, such as a parallel plate reactive ion etching system, a narrow-gap or two-frequency type parallel plate reactive ion etching system, magnetron enhanced reactive ion etching system, an inductively coupled plasma etching system, an antenna coupled plasma etching system, an electron cyclotron resonance plasma etching system and a surface wave plasma etching system.

Embodiment 7

A method for fabricating a semiconductor device (single damascene method) according to Embodiment 7 of the invention will now be described with reference to FIGS. 11A through 11D and 12A through 12D.

Figure 11A:
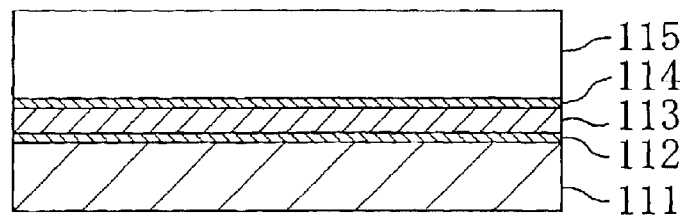
FIGS. 11A, 11B, 11C and 11D are cross-sectional views for showing procedures in a method for fabricating a semiconductor device according to Embodiment 7 of the invention.
Figure 11B:
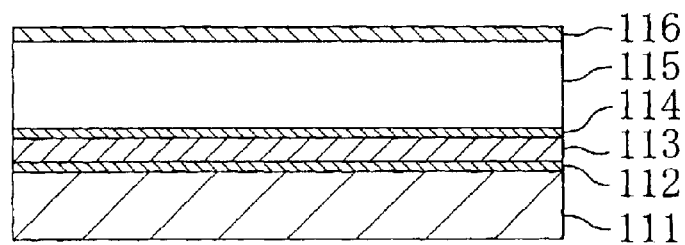

First, as is shown in FIG. 11A, a laminated metal interconnect consisting of a first barrier metal layer 112, a conducting film 113 and a second barrier metal layer 114 is formed on a semiconductor substrate 111, and an organic film 115 is formed on the interconnect. Thereafter, as is shown in FIG. 11B, a silicon oxide film 116 is formed on the organic film 115.

Figure 11C:
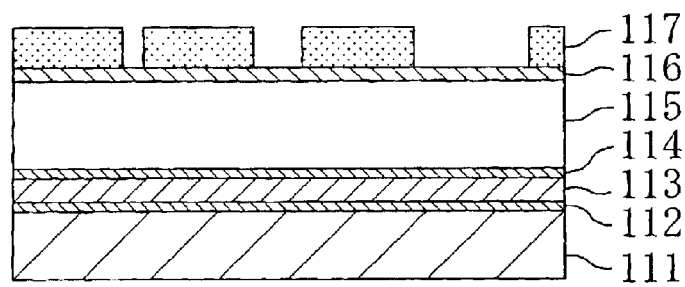
Figure 11D:
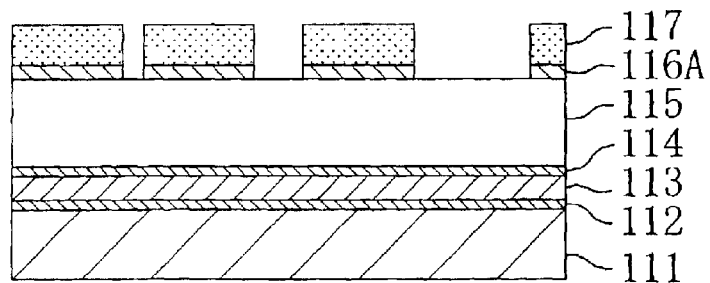

Next, as is shown in FIG. 11C, a resist pattern 117 is formed on the silicon oxide film 116 by a known lithography technique. Thereafter, the silicon oxide film 116 is subjected to plasma etching (dry etching) by using the resist pattern 117 as a mask, thereby forming a mask pattern 116A from the silicon oxide film 116 as is shown in FIG. 11D. The type of etching gas used in the plasma etching is not specified, and for example, a gas including fluorocarbon may be used.

Figure 12A:
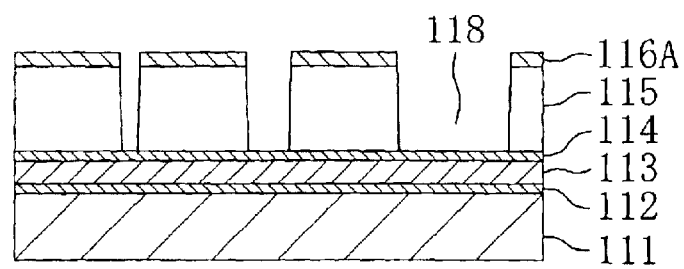
FIGS. 12A, 12B, 12C and 12D are cross-sectional views for showing other procedures in the method for fabricating a semiconductor device of Embodiment 7.

Subsequently, in the same manner as in any of Embodiments 1 through 6, the organic film 115 is etched by using the resist pattern 117 and the mask pattern 116A as masks and by using plasma generated from an etching gas mainly including a gas of a compound including carbon, hydrogen and nitrogen. Thus, a recess 118 having a forward taper cross-section to be used as a via hole or an interconnect groove is formed in the organic film 115 as is shown in FIG. 12A. The conditions for this etching are the same as those employed in the etching method for any of Embodiments 1 through 6. Since the resist pattern 117 is formed from an organic compound, it is removed during the etching of the organic film 115.

Figure 12B:
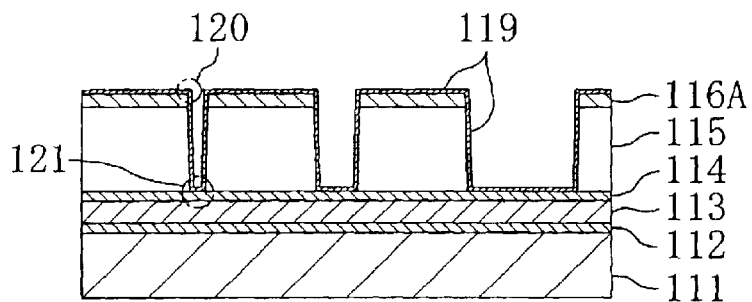

Next, after cleaning the inside of the recess 118 and the top face of the mask pattern 116A, a third barrier metal layer 119 of TiN or TaN with a small thickness is formed on the wall of the recess 118 by sputtering as is shown in FIG. 12B. In this case, the recess 118 has the forward taper cross-section because it is formed by the etching method according to any of Embodiments 1 through 6. Therefore, the third barrier metal layer 119 can be uniformly continuously formed without having a separated portion (disconnected portion) in a portion 120 in the vicinity of the interface between the mask pattern 116A and the organic film 115 (a portion just below the mask pattern 116A) and on a bottom 121 of the recess 118.

Figure 12C:
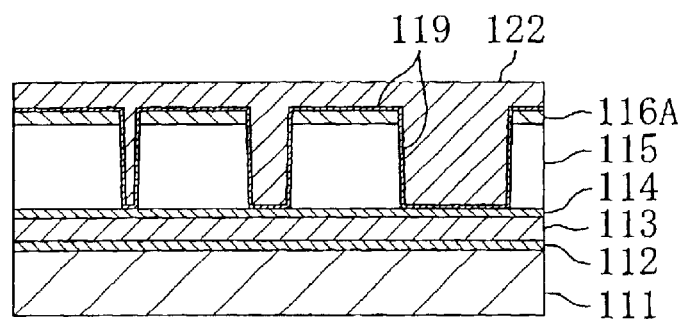
Figure 12D:
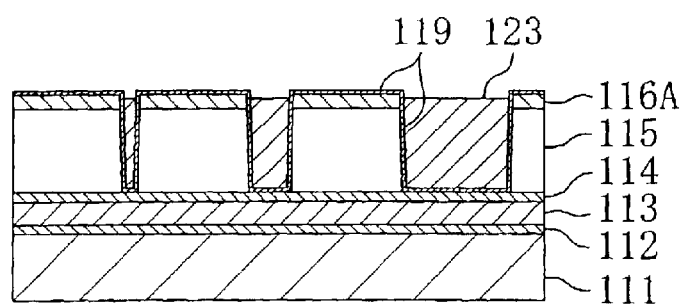

Then, as is shown in FIG. 12C, the recess 118 is filled with a conducting film 122 by chemical vapor deposition or plating, and a portion of the conducting film 122 exposed outside the recess 118 is removed by chemical mechanical polishing. In this manner, a connection plug or interconnect 123 is obtained as is shown in FIG. 12D. Thereafter, the aforementioned procedures of Embodiment 7 are repeated so as to alternately form a connection plug and an interconnect, resulting in fabricating a multi-level interconnect structure.

Since the recess 118 has a forward taper cross-section in Embodiment 7, the third barrier metal layer 119 can be uniformly continuously formed. Therefore, the conducting film 122 can be uniformly filled. As a result, the electric characteristic is never degraded, resulting in improving the reliability of the semiconductor device.

In Embodiment 7, the conducting film 122 can be formed from, for example, a polysilicon film, a W film, an AlCu film, a Cu film, an Ag film, an Au film or a Pt film.

Furthermore, the materials for the first barrier metal layer 112 and the second barrier metal layer 114 may be selected so as to accord with the conducting film 113, and for example, a laminated film including a Ti film and a TiN film or a Ta film and a TaN film may be used.

Moreover, an insulating film of a $Si_3N_4$ film or the like may be used as a barrier layer instead of the second barrier metal layer 114. In this case, after the etching of the organic film for forming the recess 118, the $Si_3N_4$ film is additionally etched.

Although the mask pattern 116A of Embodiment 7 is formed from a silicon oxide film, it can be formed from a silicon nitride film instead, whereas the material for the silicon nitride film preferably has a smaller dielectric constant than the silicon oxide film. From this point of view, a material with a small dielectric constant such as a-SiC:H is preferably used.

Also, in the case where the mask pattern 116A is also removed in removing the conducting film 122 by the chemical mechanical polishing, the mask pattern 116A may be formed from a material with a large dielectric constant, such as a conducting film of titanium or the like, a silicon nitride film, or a metal nitride film of titanium nitride or the like.

Embodiment 8

A method for fabricating a semiconductor device (dual damascene method) according to Embodiment 8 of the invention will now be described with reference to FIGS. 13A through 13D and 14A through 14C.

Figure 13A:
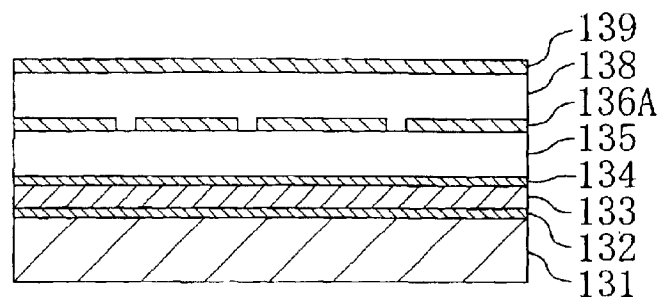
FIGS. 13A, 13B, 13C and 13D are cross-sectional views for showing procedures in a method for fabricating a semiconductor device according to Embodiment 8 of the invention.

First, as is shown in FIG. 13A, a lower laminated metal interconnect consisting of a first barrier metal layer 132, a conducting film 133 and a second barrier metal layer 134 is formed on a semiconductor substrate 131. Thereafter, a first organic film 135, a first mask pattern 136A of a first silicon oxide film having an opening for a via hole, a second organic film 138 and a second silicon film 139 are successively formed on the lower interconnect.

Figure 13B:
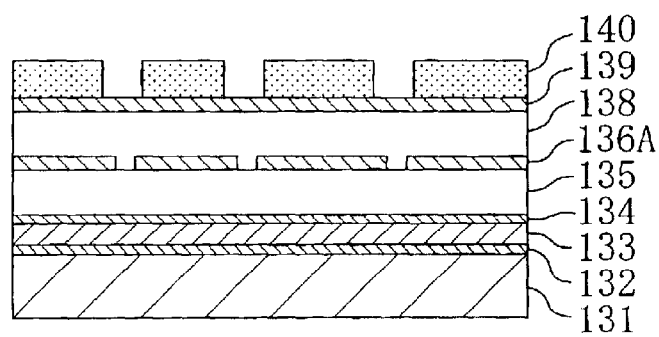
Figure 13C:
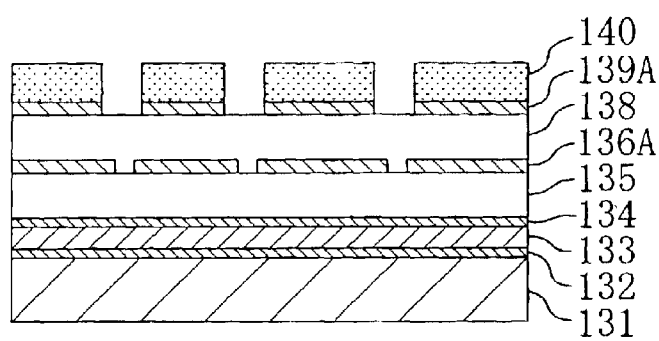

Next, as is shown in FIG. 13B, after a resist pattern 140 having an opening for an interconnect groove is formed on the second silicon oxide film 139, the second silicon oxide film 139 is etched by using the resist pattern 140 as a mask, thereby forming a second mask pattern 139A from the second silicon oxide film 139 as is shown in FIG. 13C.

Figure 13D:
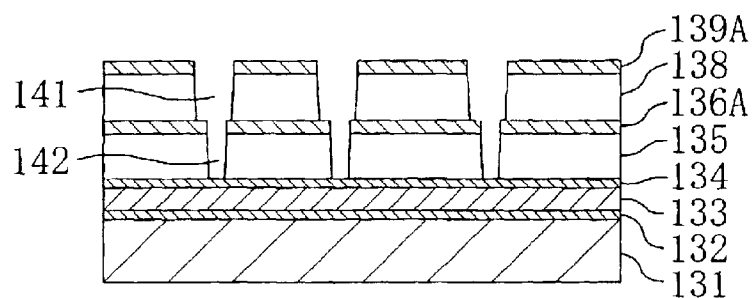

Then, the second organic film 138 and the first organic film 135 are etched by using plasma generated from an etching gas mainly including a gas of a compound including carbon, hydrogen and nitrogen in the same manner as in any of Embodiments 1 through 6. Thus, as is shown in FIG. 13D, an interconnect groove 141 is formed by transferring the second mask pattern 139A onto the second organic film 138 and a via hole 142 is formed by transferring the first mask pattern 136A onto the first organic film 135. The conditions for this etching are the same as those for the etching method according to any of Embodiments 1 through 6.

Since the via hole 142 and the interconnect groove 141 are formed by the etching method for any of Embodiments 1 through 6, each of the via hole 142 and the interconnect groove 141 has a forward taper cross-section.

During the etching of the first organic film 135, deposition films are formed on the top face of the first mask pattern 136A substantially working as a mask and on the wall of its opening, and during over-etching of the first organic film 135 after forming the via hole 142, deposition films are formed on the wall and the bottom of the via hole 142. Therefore, the opening of the first mask pattern 136A can be prevented from being enlarged by ion sputtering.

Furthermore, a thin deposition film deposited on the second barrier metal layer 134 exposed on the bottom of the via hole 142 prevents the second barrier metal layer 134 from being ion-sputtered.

Figure 21A:
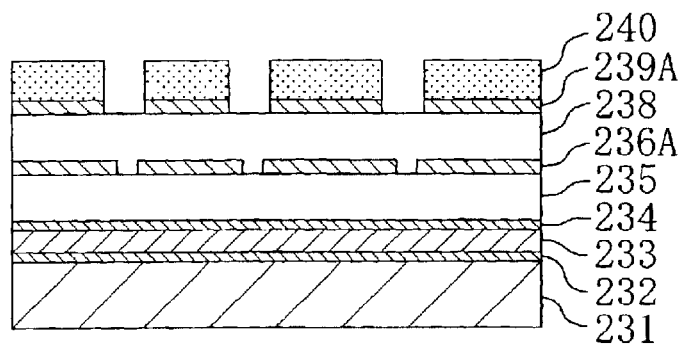
FIGS. 21A, 21B and 21C are cross-sectional views for showing still other procedures in the conventional method for fabricating a semiconductor device (dual damascene process)
Figure 21B:
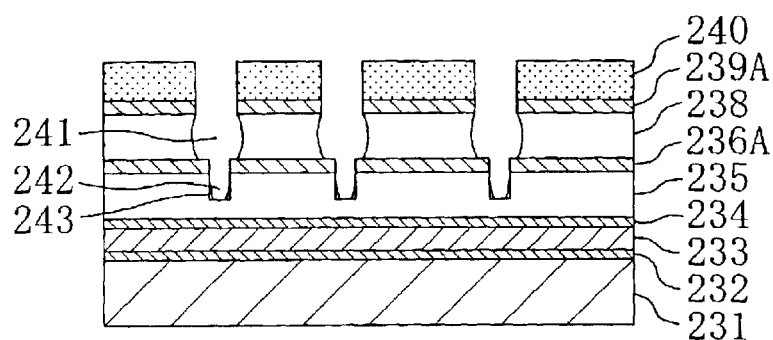
Figure 21C:
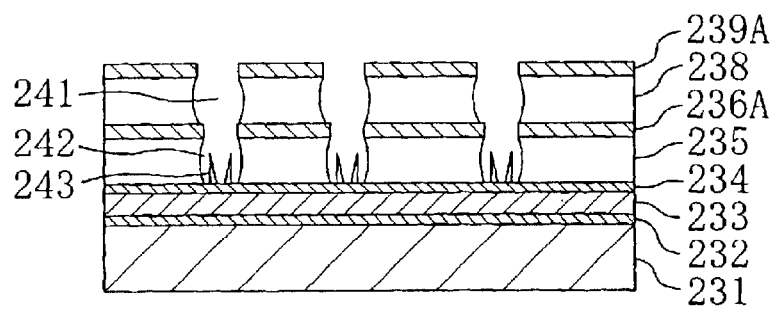
Figure 22A:
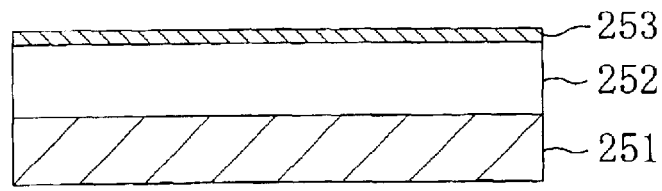
FIGS. 22A, 22B, 22C and 22D are cross-sectional views for showing procedures in a conventional method for forming a mask pattern (top surface imaging process)
Figure 22B:
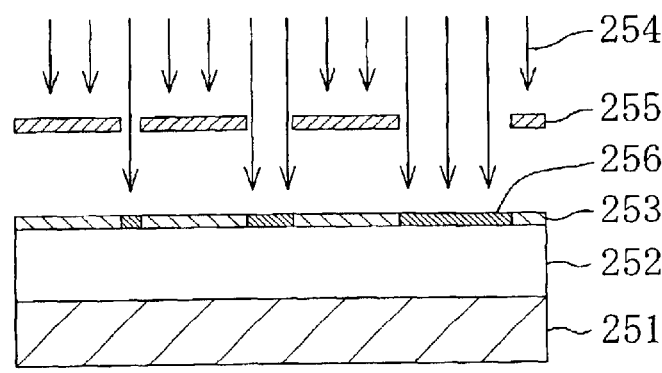
Figure 22C:
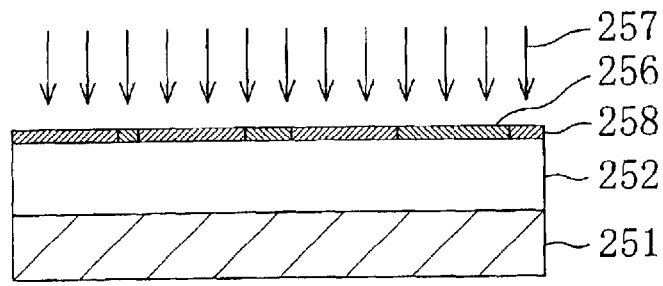
Figure 22D:
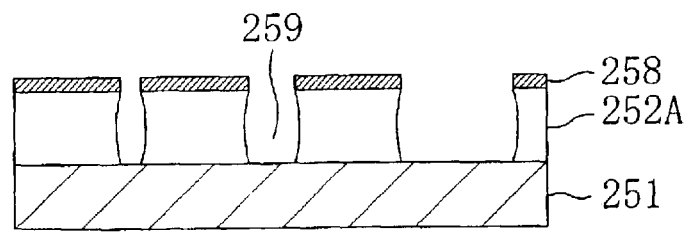
Figure 23A:
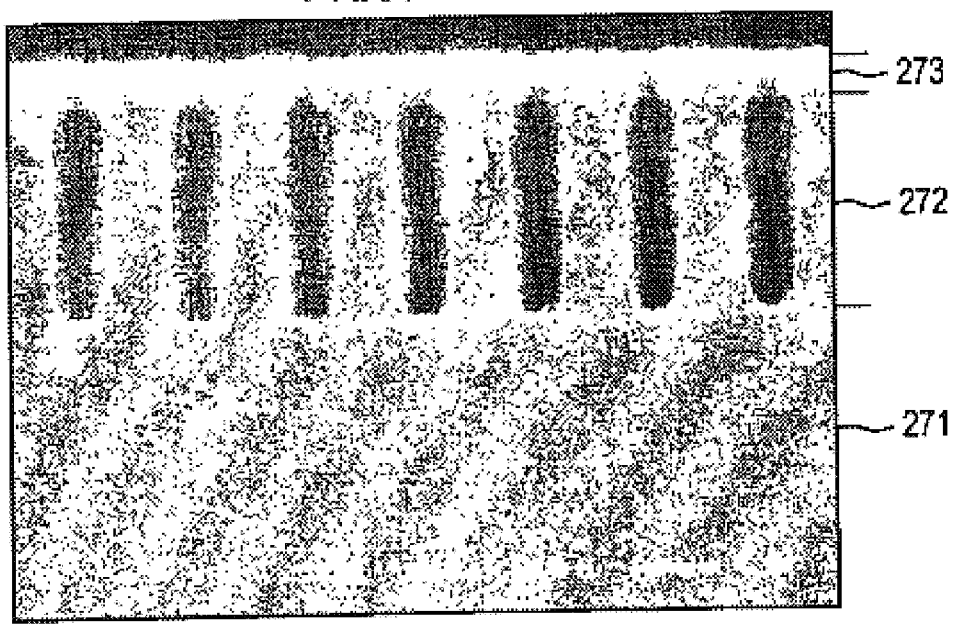
FIGS. 23A and 23B are cross-sectional SEM photographs of holes formed by a conventional method for forming a mask pattern (three-layer resist process).
Figure 23B:
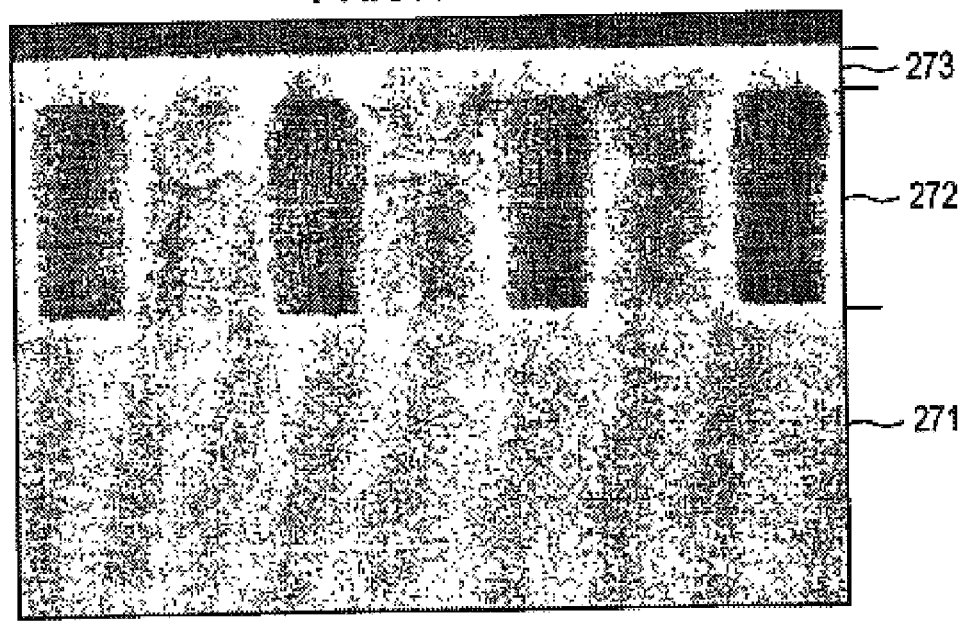

Owing to these two phenomena, the crown-shaped barrier wall 243 (shown in FIG. 21C) corresponding to the problem of Conventional Example 3 is never formed.

Figure 14A:
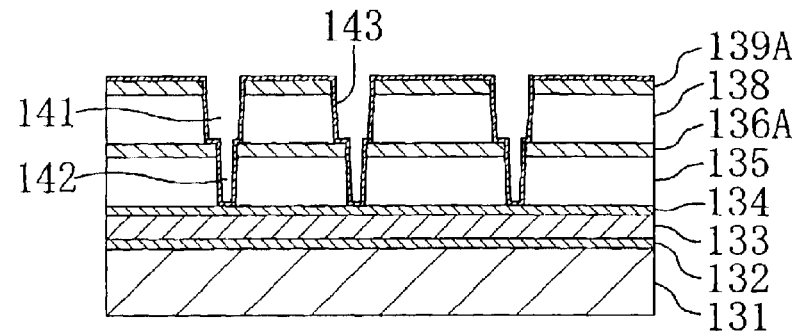
FIGS. 14A, 14B and 14C are cross-sectional views for showing other procedures in the method for fabricating a semiconductor device of Embodiment 8.

Next, after cleaning the inside of the via hole 142 and the interconnect groove 141 and the top face of the second mask pattern 139A, a third barrier metal layer 143 of TiN or TaN with a small thickness is formed on the walls of the via hole 142 and the interconnect groove 141 by the sputtering or the CVD as is shown in FIG. 14A. In this case, since each of the via hole 142 and the interconnect groove 141 has the forward taper cross-section, the third barrier metal layer 143 can be uniformly continuously formed without having a separated portion (disconnected portion).

Figure 14B:
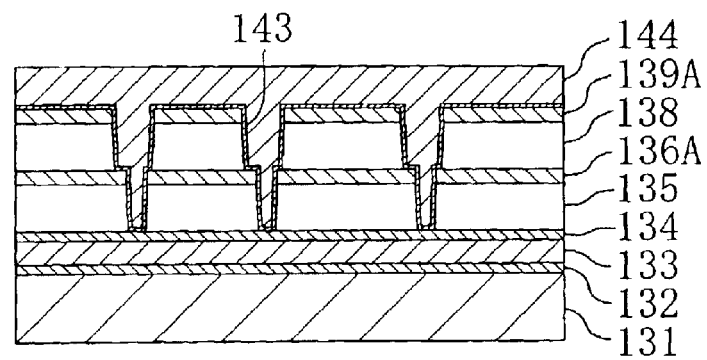
Figure 14C:
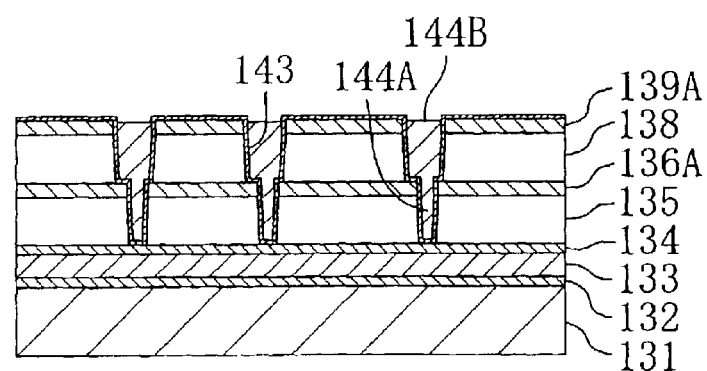

Then, as is shown in FIG. 14B, the via hole 142 and the interconnect groove 141 are filled with a conducting film 144 by the chemical vapor deposition or plating, and thereafter, a portion of the conducting film 144 exposed outside the interconnect groove 141 is removed by the chemical mechanical polishing. In this manner, a connection plug 144A and an upper interconnect 144B are formed from the conducting film 144.

Since each of the via hole 142 and the interconnect groove 141 has the forward taper cross-section in Embodiment 8, the third barrier metal layer 143 can be uniformly and continuously formed. Therefore, the conducting film 144 can be uniformly filled, resulting in obtaining good connection plug 144A and upper interconnect 144B. Also, since no crown-shaped barrier wall is formed on the bottom of the via hole 142, good connection can be obtained between the connection plug 144A and the lower interconnect.

Accordingly, a multi-level interconnect structure with high reliability can be formed by the dual damascene method according to Embodiment 8.

In Embodiment 8, the conducting film 133 for forming the lower interconnect and the conducting film 144 for forming the upper interconnect are made from, for example, a polysilicon film, a W film, an AlCu film, a Cu film, an Ag film, an Au film or a Pt film.

Also, the materials for the first barrier metal layer 132, the second barrier metal layer 134 and the third barrier metal layer 143 can be selected so as to accord with the conducting films 133 and 144. For example, each barrier film may be formed from a laminated film of a Ti film and a TiN film or a Ta film and a TaN film.

Moreover, an insulating film of $Si_3N_4$ or the like may be used as a barrier layer instead of the second barrier metal layer 134. In this case, after conducting the etching of the organic film for forming the via hole 142, the $Si_3N_4$ film is additionally etched.

Although the first mask pattern 136A and the second mask pattern 139A are formed from the silicon oxide films in Embodiment 8, a silicon nitride film may be used instead, whereas the material for the silicon nitride film preferably has a smaller dielectric constant than that of the silicon oxide film. Form this point of view, a material with a small dielectric constant, such as a-SiC:H, is preferably used.

In the case where the second mask pattern 139A is also removed in removing the conducting film 144 by the chemical mechanical polishing, the second mask pattern 139A may be formed from a material with a large dielectric constant, such as a conducting film of titanium or the like, a silicon nitride film, or a metal nitride film of titanium nitride or the like.

Embodiment 9

A method for forming a mask pattern (top surface imaging process) according to Embodiment 9 of the invention will now be described with reference to FIGS. 15A through 15D.

Figure 15A:
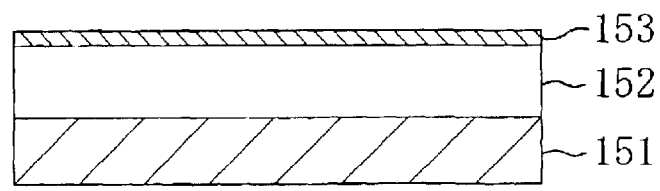
FIGS. 15A, 15B, 15C and 15D are cross-sectional views for showing procedures in a method for forming a mask pattern according to Embodiment 9 of the invention.

First, as is shown in FIG. 15A, an organic film 152 is formed on a semiconductor substrate 151, and then a sylation target layer 153 is formed on the organic film 152.

Figure 15B:
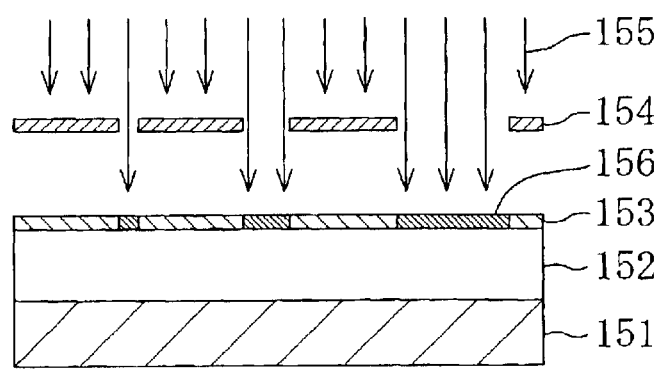

Next, as is shown in FIG. 15B, the silylation target layer 153 is irradiated with exposing light 155 through a photomask 154 for selectively allowing the light to pass, thereby selectively forming a decomposed layer 156 in the silylation target layer 153.

Figure 15C:
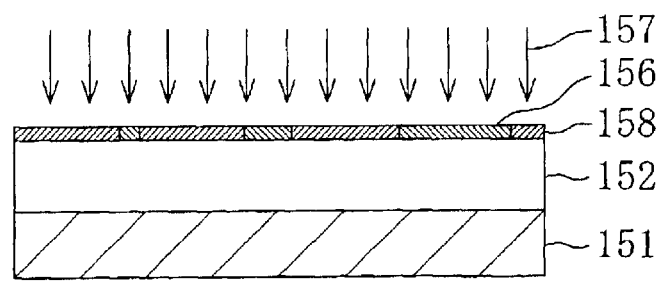

Then, as is shown in FIG. 15C, with the substrate temperature increased, a gaseous silylation reagent 157 is supplied onto the surface of the silylation target layer 153, thereby selectively silylating a non-decomposed portion (a portion excluding the decomposed layer 156) of the silylation target layer 153. Thus, a silylated layer 158 is formed.

Instead of silylating the non-decomposed portion, the decomposed layer 156 may be silylated to form the silylated layer 158, or the silylated layer 158 may be directly formed on the organic film 152 without forming the silylation target layer 153.

Figure 15D:
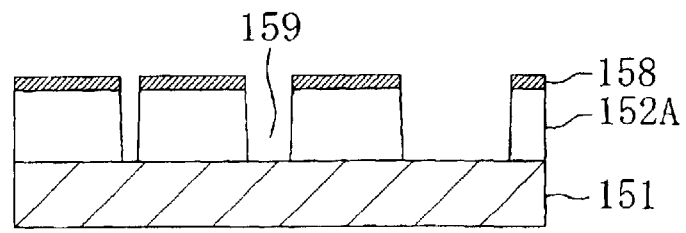
Figure 17A:
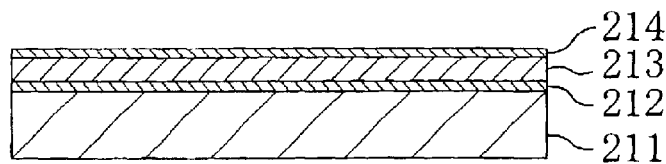
FIGS. 17A, 17B, 17C, 17D and 17E are cross-sectional views for showing procedures in a conventional method for fabricating a semiconductor device (single damascene process)
Figure 17B:
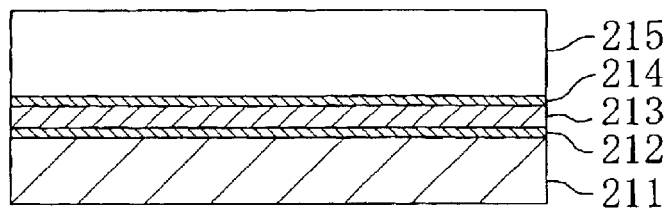
Figure 17C:
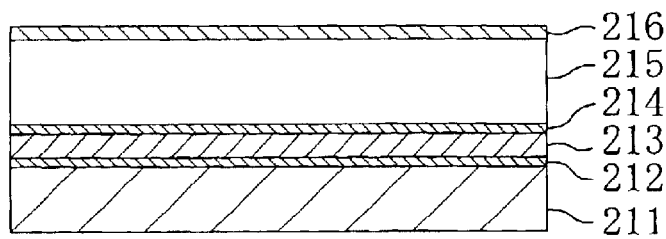
Figure 17D:
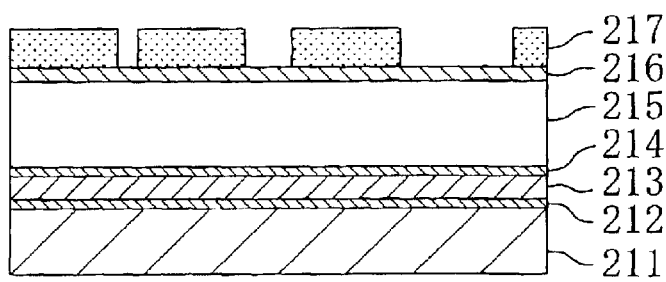
Figure 17E:
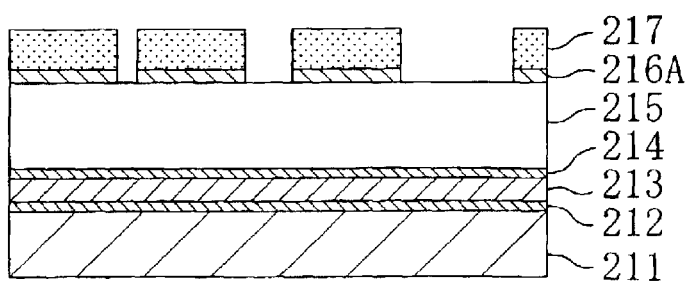
Figure 18A:
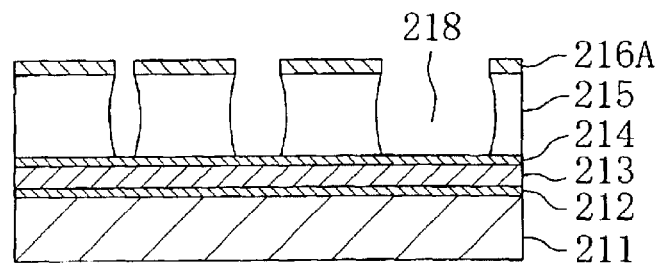
FIGS. 18A, 18B, 18C and 18D are cross-sectional views for showing other procedures in the conventional method for fabricating a semiconductor device (single damascene process)
Figure 18B:
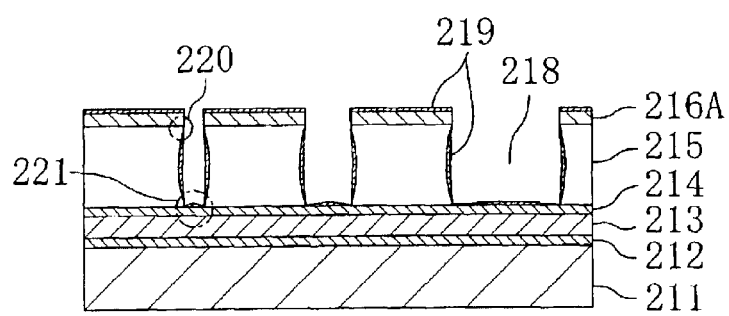
Figure 18C:
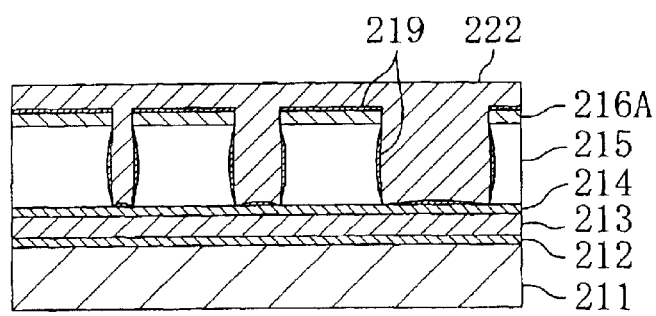
Figure 18D:
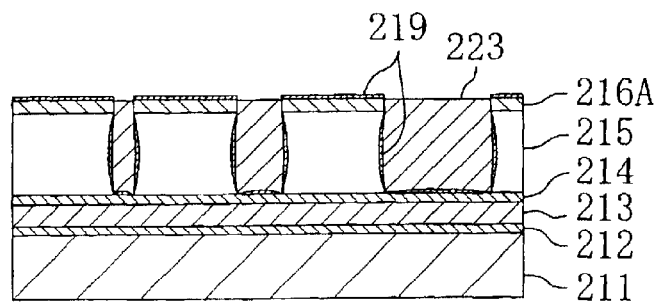
Figure 19A:
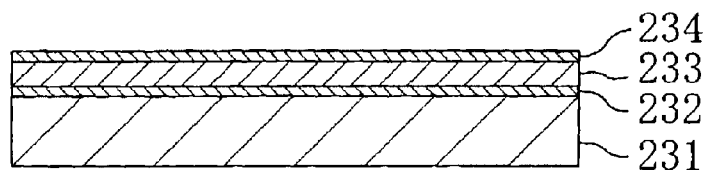
FIGS. 19A, 19B, 19C and 19D are cross-sectional views for showing procedures in a conventional method for fabricating a semiconductor device (dual damascene process)
Figure 19B:
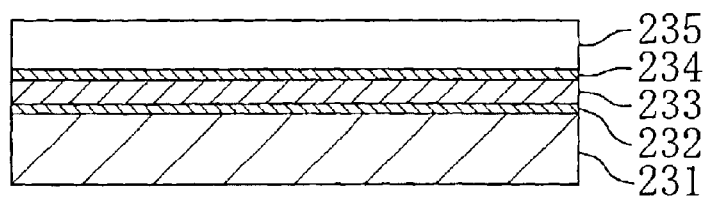
Figure 19C:
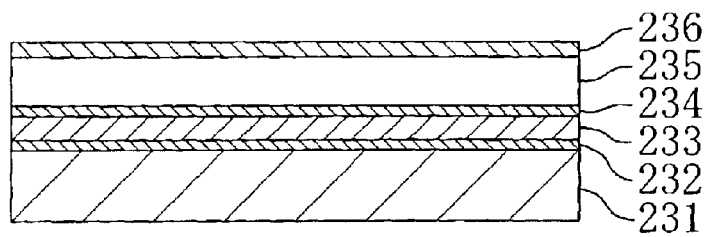
Figure 19D:
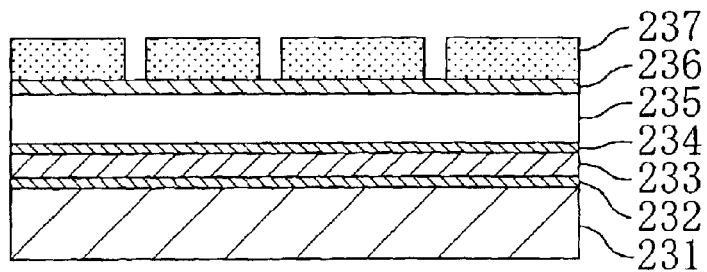
Figure 20A:
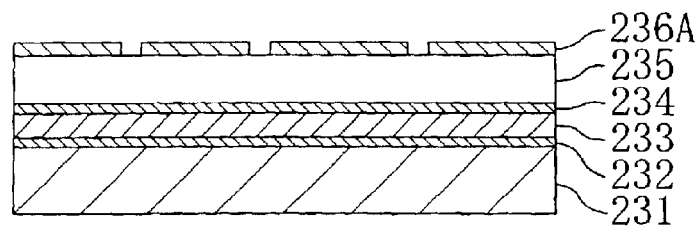
FIGS. 20A, 20B and 20C are cross-sectional views for showing other procedures in the conventional method for fabricating a semiconductor device (dual damascene process)
Figure 20B:
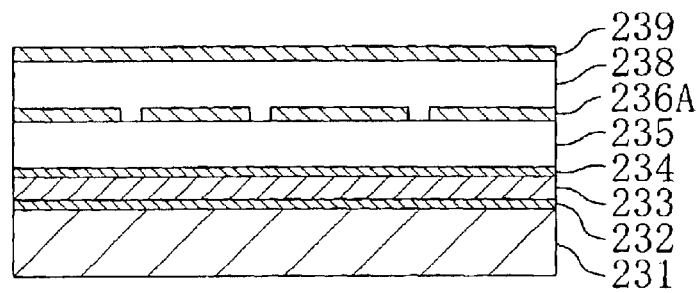
Figure 20C:
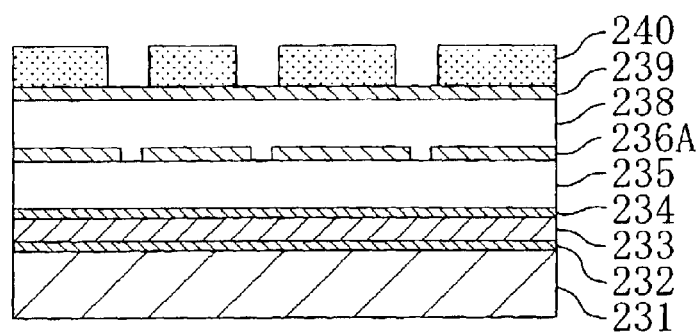

Next, by using the silylated layer 158 as a mask, the organic film 152 is etched by using plasma generated from an etching gas mainly including a gas of a compound including carbon, hydrogen and nitrogen in the same manner as in any of Embodiments 1 through 6. In this manner, an organic film pattern 152A is formed from the organic film 152 as is shown in FIG. 15D.

Since the organic film 152 is subjected to the plasma etching by using the etching gas mainly including the gas of the compound including carbon, hydrogen and nitrogen in Embodiment 9, a recess 159 formed in the organic film pattern 152A has a forward taper cross-section. Specifically, the recess 159 is prevented from having a cross-section in a bowing shape as in Conventional Example 4 and the organic film pattern 152A with a good cross-sectional shape can be obtained. Accordingly, an etch target film formed on the semiconductor substrate 151 can be precisely etched.

Also, since there is no need to add a deposition gas to the etching gas in Embodiment 9, RIE lag can be minimized. Therefore, even when a fine pattern is to be formed, a process margin such as allowance in etching amount can be sufficiently kept, and time for over-etching can be reduced to reduce a dimensional difference in transferring a pattern. As a result, a fine pattern can be precisely formed.

Although a silicon substrate is used as the semiconductor substrate 151 in Embodiment 9, the substrate may be a glass substrate used in a liquid crystal display panel or the like or a substrate of a compound semiconductor instead.

What is claimed is:

1. A method for fabricating a semiconductor device comprising the steps of:
   forming an organic film on a semiconductor substrate;
   forming, on said organic film, a mask pattern including an inorganic compound as a principal constituent; and
   forming a recess in said organic film by selectively etching said organic film by using said mask pattern and by using plasma generated from etching gas containing a first gas selected from the group consisting of methylamine, dimethylamine, trimethylamine, ethylamine and propylamine and a second gas including a nitrogen component.

2. The method for fabricating a semiconductor device of claim 1, wherein said second gas is a nitrogen gas.

3. The method for fabricating a semiconductor device of claim 1,
   wherein said second gas is a mixed gas including a nitrogen gas and a hydrogen gas.

4. The method for fabricating a semiconductor device of claim 1,
   wherein said second gas is an ammonia gas.

5. The method for fabricating a semiconductor device of claim 1,
   wherein said second gas further includes a rare gas.

6. The method for fabricating a semiconductor device of claim 1,
   wherein said recess includes a via hole and an interconnect groove formed above said via hole and is filled with a conducting film by a dual damascene method.

7. A method for fabricating a semiconductor device comprising the steps of:
   forming an organic film on a semiconductor substrate;
   forming, on said organic film, a mask pattern including an inorganic compound as a principal constituent; and
   forming a recess in said organic film by selectively etching said organic film by using said mask pattern and by using plasma generated from etching gas containing a first gas selected from the group consisting a methylamine, dimethylamine, trimethylamine, ethylamine and propylamine and a second gas including a rare gas.

8. The method for fabricating a semiconductor device of claim 7,
   wherein said recess includes a via hole and an interconnect groove formed above said via hole and is filled with a conducting film by a dual damascene method.

9. A method for fabricating a semiconductor device comprising the steps of:
   forming an organic film on a semiconductor substrate;
   forming, on said organic film, a mask pattern including an inorganic compound as a principal constituent; and
   forming a recess in said organic film by selectively etching said organic film by using said mask pattern and by using plasma generated from an etching gas containing a first gas selected from the group consisting of methylamine, dimethylamine, trimethylamine, ethylamine and propylamine and a second gas including an oxygen component.

10. The method for fabricating a semiconductor device of claim 9,
    wherein said second gas further includes a rare gas.

11. The method for fabricating a semiconductor device of claim 9,
    wherein said recess includes a via hole and an interconnect groove formed above said via hole and is filled with a conducting film by a dual damascene method.

12. A pattern formation method comprising the steps of:
    forming an organic film on a substrate;
    forming, on said organic film, a mask layer including an inorganic component; and
    forming an organic film pattern from said organic film by selectively etching said organic film by using said mask layer and by using plasma generated from an etching gas including a first gas selected from the group consisting of methylamine, dimethylamine, trimethylamine, ethylamine and propylamine and a second gas including a nitrogen component.

13. The pattern formation method for claim 12,
    wherein said second gas is a nitrogen gas.

14. The pattern formation method for claim 12,
    wherein said second gas is a mixed gas including a nitrogen gas and a hydrogen gas.

15. The pattern formation method for claim 12,
    wherein said second gas is an ammonia gas.

16. The pattern formation method for claim 12,
    wherein said second gas further includes a rare gas.

17. The pattern formation method for claim 12,
    wherein said mask layer is a silylated layer.

18. A pattern formation method comprising the steps of:
    forming an organic film on a substrate;
    forming, on said organic film, a mask layer including an inorganic component; and
    forming an organic film pattern from said organic film by selectively etching said organic film by using said mask layer and by using plasma generated from an etching gas containing a first gas selected from the group consisting of methylamine, dimethylamine, trimethylamine, ethylamine and propylamine and a second gas including a rare gas.

19. The pattern formation method for claim 18, wherein said mask layer is a silylated layer.

20. A pattern formation method comprising the steps of:

forming an organic film on a substrate;

forming, on said organic film, a mask layer including an inorganic component; and forming an organic film pattern from said organic film by selectively etching said organic film by using said mask layer and by using plasma generated from an etching gas containing a first gas selected from the group consisting of methylamine, dimethylamine, trimethylamine, ethylamine and propylamine and a second gas including an oxygen component.

21. The pattern formation method for claim 20, wherein said second gas further includes a rare gas.

22. The pattern formation method for claim 20, wherein said mask layer is a silylated layer.

* * * * *

UNITED STATES PATENT AND TRADEMARK OFFICE
CERTIFICATE OF CORRECTION

PATENT NO. : 6,828,247 B2
DATED : December 7, 2004
INVENTOR(S) : Hideo Nakagawa et al.

It is certified that error appears in the above-identified patent and that said Letters Patent is hereby corrected as shown below:

Column 29,
Line 46, "from etching" should read -- from an etching. --.

Column 30,
Line 8, "from etching" should read -- from an etching. --.

Signed and Sealed this

Seventh Day of March, 2006

JON W. DUDAS
*Director of the United States Patent and Trademark Office*